(12) United States Patent
Yen et al.

(10) Patent No.: US 12,490,586 B2
(45) Date of Patent: Dec. 2, 2025

(54) LIGHT-EMITTING ASSEMBLY

(71) Applicant: TAIZHOU GUANYU TECHNOLOGY CO., LTD., Zhejiang Province (CN)

(72) Inventors: Chih-Cheng Yen, Hsinchu County (TW); Kuo-Cheng Hsu, Taichung (TW); Cheng-Yi Huang, Hsinchu County (TW)

(73) Assignee: TAIZHOU GUANYU TECHNOLOGY CO., LTD., Zhejiang Province (CN)

( * ) Notice: Subject to any disclaimer, the term of this patent is extended or adjusted under 35 U.S.C. 154(b) by 293 days.

(21) Appl. No.: 18/341,754

(22) Filed: Jun. 26, 2023

(65) Prior Publication Data

US 2024/0065025 A1 Feb. 22, 2024

(51) Int. Cl.
*H10K 50/86* (2023.01)
*H10K 50/858* (2023.01)

(52) U.S. Cl.
CPC ......... *H10K 50/865* (2023.02); *H10K 50/858* (2023.02)

(58) Field of Classification Search
CPC .......................... H10K 50/865; H10K 50/858
USPC ................................................ 313/498–512
See application file for complete search history.

(56) References Cited

U.S. PATENT DOCUMENTS

| | | |
|---|---|---|
| 2005/0189535 A1 | 9/2005 | Hsueh et al. |
| 2016/0363778 A1 | 12/2016 | Lin |
| 2017/0017453 A1 | 1/2017 | Hoshino et al. |
| 2021/0066643 A1* | 3/2021 | Choi ................ H10K 59/80521 |
| 2021/0175468 A1* | 6/2021 | Lee .................... H10K 59/8731 |

(Continued)

FOREIGN PATENT DOCUMENTS

| | | |
|---|---|---|
| CN | 104166177 A | 11/2014 |
| CN | 106856229 A | 6/2017 |
| CN | 108878675 A | 11/2018 |

(Continued)

OTHER PUBLICATIONS

First Office Action, Cited Reference and Search Report dated Feb. 27, 2024 issued by the Japan Patent Office for JP counterpart application No. 2023-109753.
English Abstract of WO2021152418A1.
Brief English translation of First Office Action dated Feb. 27, 2024 issued by the Japan Patent Office for JP counterpart application No. 2023-109753.

(Continued)

*Primary Examiner* — Christopher M Raabe
(74) *Attorney, Agent, or Firm* — WPAT LAW; Anthony King

(57) ABSTRACT

The application relates to a light-emitting assembly including a substrate and an effective light-emitting region. The substrate has a first surface and a second surface that are opposite to each other and has a transparent material. The light shielding layer is disposed on the first surface of the substrate, and a first edge and a second edge of the light shielding layer are spaced apart from each other, thereby forming an opening. The effective light-emitting region is defined on the second surface of the substrate, and the effective light-emitting region and the first edge of the light shielding layer are offset by a first distance in a lateral direction. The first distance is associated with a refractive index of the substrate, a refractive index of a material in the opening of the light shielding layer, and a thickness of the substrate.

17 Claims, 14 Drawing Sheets

(56) References Cited

U.S. PATENT DOCUMENTS

2023/0247865 A1* 8/2023 Cui ...................... H10K 59/126
                                                    257/40
2025/0098497 A1* 3/2025 Kim ...................... H10K 59/40

FOREIGN PATENT DOCUMENTS

| | | | |
|---|---|---|---|
| CN | 107221602 | B | 9/2019 |
| CN | 112956044 | A | 6/2021 |
| CN | 113178529 | A | 7/2021 |
| JP | 2008277270 | A | 11/2008 |
| TW | 200529695 | A | 9/2005 |
| TW | 202131536 | A | 8/2021 |
| WO | 2020243740 | A1 | 12/2020 |
| WO | 2021152418 | A1 | 8/2021 |

OTHER PUBLICATIONS

Extend European Search Report from the European Patent Office of EP patent application 23183451.6 dated Dec. 19, 2023.
Allowance Notification, Cited References and Search Report dated Nov. 28, 2024 issued by the Taiwan Intellectual Property Office for the Taiwan Counterpart Application No. 112122447.
English Abstract Translation of CN 112956044 A.
English Abstract Translation of CN 104166177 A.
English Abstract Translation of TW 202131536 A.
English Abstract Translation of TW 200529695 A.
Office Action, Cited References and Search Report dated Mar. 15, 2024 issued by the Taiwan Intellectual Property Office for the Taiwan Counterpart Application No. 112122447.
Office Action dated Oct. 20, 2025 issued by the EPO for the counterpart EP Application No. 23183451.6.
English Abstract Translation of JP2008277270A.

* cited by examiner

LIGHT-EMITTING ASSEMBLY

TECHNICAL FIELD

The present disclosure relates to a light-emitting assembly and, in particular, to an organic light-emitting assembly.

BACKGROUND

Organic light-emitting displays have been widely used in the most high-end electronic devices. However, due to the limitations of the existing technology, the luminous effect of the luminescent material in the organic light-emitting display cannot be effectively controlled, causing the problems of easy generation of image defects when consumers expect to expand the viewing angle, resulting in the optical effect of the organic light-emitting display not as expected. The present disclosure provides a device that can solve the above-mentioned dilemma.

SUMMARY

One of the technical problems to be solved in the present application is to overcome the shortcomings of the above-mentioned prior art and provide a light-emitting assembly, which includes a light-shielding layer disposed on a substrate, which blocks (or absorbs) light of a specific wavelength. The first distance offset in the lateral direction between the effective light-emitting region arranged on the other side of the substrate and an edge of the light shielding layer is associated with the refractive index of the substrate, the refractive index of the material in the opening of the light shielding layer, and the thickness of the substrate, in order to solve the problem of image incompleteness, increase the maximum viewing angle, and design the display with the best applicable viewing angle according to the requirements of different application scenarios.

One aspect of the present application provides a light-emitting assembly, which includes a substrate and an effective light-emitting region. The substrate has a first surface and a second surface that are opposite to each other and has a transparent material. The light shielding layer is disposed on the first surface of the substrate, and a first edge and a second edge of the light shielding layer are spaced apart from each other, thereby forming an opening. The effective light-emitting region is defined on the second surface of the substrate, and the effective light-emitting region and the first edge of the light shielding layer are offset by a first distance in a lateral direction. The first distance is associated with a refractive index of the substrate, a refractive index of a material in the opening of the light shielding layer, and a thickness of the substrate.

In some embodiments, the first distance is further associated with an incident angle of light emitted by a first outer edge of the effective light-emitting region to the first edge of the light shielding layer and an exit angle of the light on the first surface.

In some embodiments, the first distance is $D_1$, the refractive index of the substrate is $n_1$, the refractive index of the material in the opening of the light shielding layer is $n_2$, the exit angle of the light on the first surface is $\theta_2$, and the thickness of the substrate is $L$, wherein the distance $D_1$ satisfies the following formula:

$$D_1 = \frac{n_2 L \sin\theta_2}{\sqrt{n_1^2 - n_2^2 \sin^2\theta_2}}.$$

In some embodiments, the effective light-emitting region is offset from the second edge of the light-shielding layer by a second distance in the lateral direction, wherein the second distance is associated with the refractive index of the substrate, the refractive index of the material in the opening of the light shielding layer, and the thickness of the substrate.

In some embodiments, the second distance is further associated with an incident angle of light emitted by a second outer edge of the effective light-emitting region to the second edge of the light shielding layer and an exit angle of the light on the first surface of the substrate.

In some embodiments, the light-emitting assembly further includes a conductive layer, of which a first side surface is disposed on the second surface of the substrate, wherein a position of the conductive layer on the second surface of the substrate substantially corresponds to the opening between the light shielding layer.

In some embodiments, the light-emitting assembly further includes multiple protrusions arranged at intervals on the second surface of the substrate and at least adjacent to the conductive layer, to together jointly define an effective light-emitting region with the conductive layer.

In some embodiments, a part of the multiple protrusions covers an edge of a second side surface of the conductive layer opposite to the first side surface, thereby defining a non-effective light-emitting region of the conductive layer.

In some embodiments, the opening of the light shielding layer at least exposes the effective light-emitting region and the non-effective light-emitting region.

In some embodiments, the opening further exposes a portion of the multiple protrusions adjacent to the conductive layer.

In some embodiments, the opening in the light shielding layer has a cross-shaped profile.

In some embodiments, as seen from an outside the cross-shaped profile, the effective light-emitting region is surrounded by the non-effective light-emitting region and a part of the multiple protrusions adjacent to the conductive layer.

In some embodiments, the light-emitting assembly further includes an organic light-emitting stack layer disposed over the conductive layer and in contact with the multiple protrusions.

In some embodiments, the organic light-emitting stack layer includes a carrier injection layer; a carrier transport layer; an organic emission layer; and an organic carrier transport layer.

In some embodiments, a width of the effective light-emitting region located on the second surface of the substrate is smaller than a distance of the opening in the light shielding layer.

In some embodiments, the light-emitting assembly further includes a light-transmitting layer disposed on the first surface and covering the light shielding layer.

In some embodiments, a refractive index of the substrate is different from a refractive index of the light-transmitting layer.

BRIEF DESCRIPTION OF THE DRAWINGS

In order to clearly understand the effects that the application and its advantages can achieve, the present application is described in detail in the form of embodiments as follows in conjunction with the drawings.

DETAILED DESCRIPTION

Figure 1:
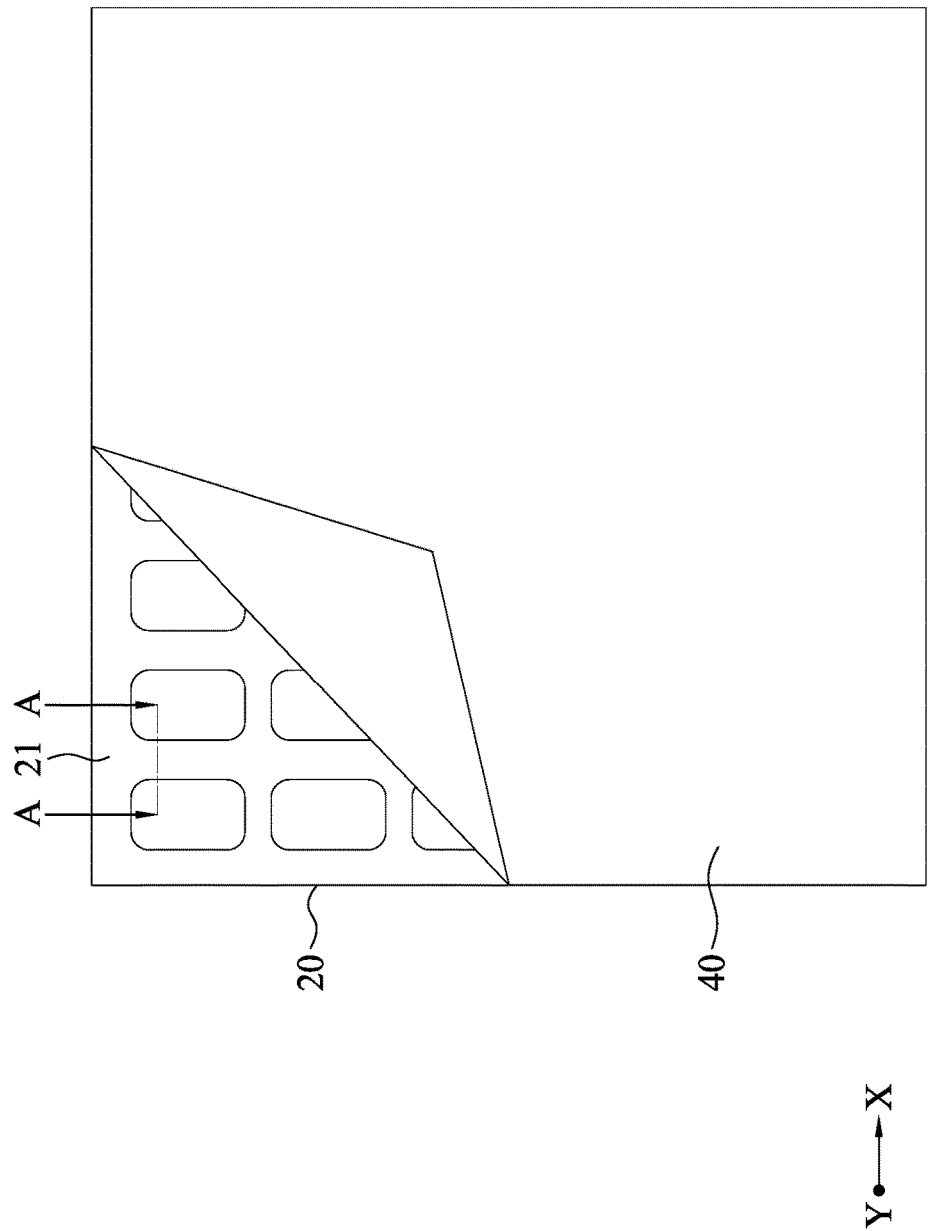
FIG. 1 is a top view of a light-emitting assembly according to an embodiment of the present disclosure, illustrating an intermediate product of the light-emitting assembly.

Embodiments of the present application will be described in detail below in conjunction with the accompanying drawings. Aspects of the present application may be understood more readily by reading the following description of specific embodiments with reference to the accompanying drawings. It should be noted that these embodiments are only exemplary, and are only used to explain and illustrate the technical solutions of the present application, rather than limiting the present application. Those skilled in the art can make various modifications and changes on the basis of these embodiments. All technical solutions obtained by transformation in an equivalent manner belong to the protection scope of the present application.

These are examples only and are not intended to limit the present disclosure. For example, the following description of forming a first feature on or over a second feature may include embodiments in which the first and second features are formed in direct contact, and may also include embodiments in which other features are formed between the first and second features so that the first and second features are not in direct contact. In addition, the application may repeat component symbols and/or letters in different examples. This repetition is for simplicity and clarity and does not dictate the relationship between the different embodiments and/or architectures discussed.

Furthermore, the application can use spatially relative terms, such as simple descriptions of "under", "below", "lower", "over", "higher" and other similar words to describe the relationship of a component or feature to another component or feature in the drawing. Spatially relative terms are intended to encompass different orientations of the device in use or operation in addition to the orientation depicted in the drawings. The device may be oriented (rotated 90 degrees or other orientations) and the spatially relative descriptions used in this application may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their individual testing measurements. Also, as used herein, "about" generally means within 10%, 5%, 1%, or 0.5% of a given value or range. Alternatively, the term "about" means within an acceptable standard error of the mean considered by those of ordinary skill in the art. Except in operating/working examples, or unless otherwise specified, all numerical ranges, amounts, values, and ratios disclosed herein, such as amounts of materials, time periods, temperatures, operating conditions, ratios of amounts, and the like, should be understood that it is modified in all cases by the word "about". Therefore, unless stated otherwise, all the numerical parameters in the present disclosure and the claims are approximate values that may vary as required. At least, each numerical parameter should be construed in light of the number of reported significant digits and by applying ordinary rounding techniques. Herein, ranges can be expressed as from one endpoint to the other, or between two endpoints. All ranges disclosed herein are inclusive of endpoints unless otherwise stated.

The main disclosure idea of the present application lies in that: a light shielding layer is disposed on one side of the substrate, which blocks (or absorbs) light of a specific wavelength. Through the relevance between the first distance offset in the lateral direction from the edge of the light shielding layer by the effective light-emitting region on the other side of the substrate and the refractive index of the substrate, the refractive index of the material within the opening of the light shielding layer and the thickness of the substrate, the problem of image incompleteness is solved, the maximum viewing angle is increased, and the display with the best applicable viewing angle can be designed according to the requirements of different application scenarios.

(1) Light-Emitting Assembly

FIG. 1 is a top view of a light-emitting assembly 10 according to an embodiment of the present application, illustrating an intermediate product of the light-emitting assembly 10. The light-emitting assembly 10 has a light-emitting layer 20 and a capping layer 40 above the light-emitting layer 20. As with the light-emitting layer 20, the spacers 21 may be arranged to provide an array of recesses for accommodating the array of light-emitting pixels. In some embodiments, the spacer 21 may include a photosensitive material.

Figure 2:
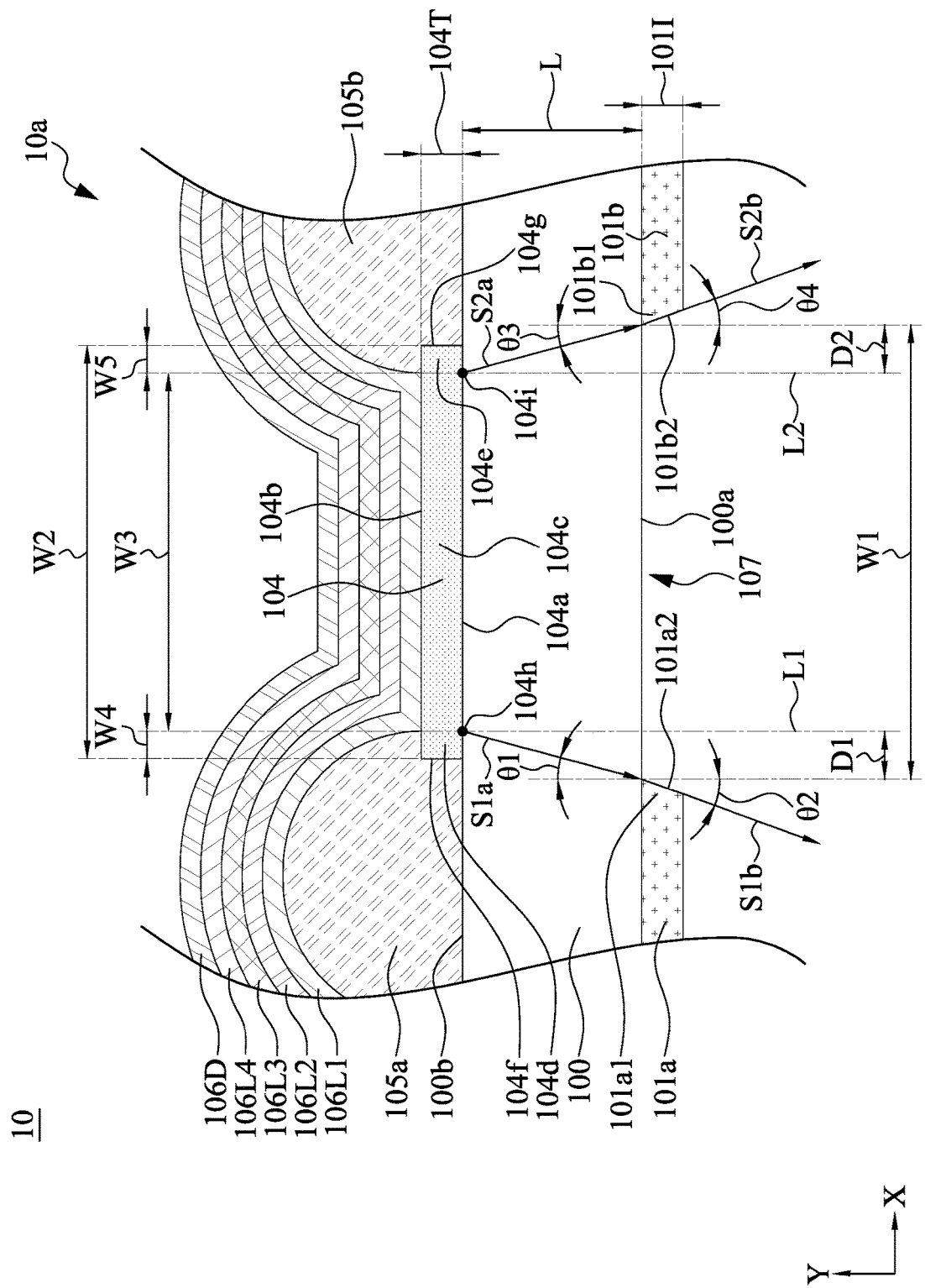
FIG. 2 is a cross-sectional view along the line AA in FIG. 1, and illustrates what is emitted by the light-emitting unit.

FIG. 2 is a cross-sectional view along the line AA in FIG. 1, and illustrates the first light S1a, S1b and the second light S2a, S2b emitted by the light-emitting unit 10a. For clarity and simplicity, the capping layer 40 is omitted herein. The spacer 21 has several protrusions 105a, 105b to define a light-emitting pixel pattern. The concave portion is between two adjacent protrusions 105a, 105b and provides a space for accommodating the light-emitting pixel. Those skilled in the art would understand that from the cross-sectional view, the protrusions 105a, 105b are shown in a disconnected manner, but from the schematic top view of FIG. 1, the protrusions 105a, 105b may be connected to each other through other parts of the spacer 21 shown in FIG. 1.

The light-emitting assembly 10 includes one or more light-emitting arrays, and the light-emitting array includes one or more light-emitting units 10a. The light-emitting unit 10a may be an organic light-emitting unit 10a, which may be referred to as a light-emitting pixel in this case. In some embodiments, the light-emitting unit 10a includes a first electrode 104 and an organic light-emitting stack layer above the protrusions 105a, 105b and the first electrode 104. In some embodiments, the organic light-emitting stack layer includes a carrier injection layer 106L1, a carrier transport layer 106L2 located over the carrier injection layer 106L1, an organic emission layer 106L3 located over a portion of the carrier transport layer 106L2, and an organic carrier transport layer 106L4 located over the organic emission layer 106L3. In other words, the carrier injection layer 106L1, the carrier transport layer 106L2, the organic emission layer 106L3 and the organic carrier transport layer 106L4 may be collectively referred to as an organic light-emitting stack layer.

In some embodiments, the carrier injection layer 106L1 is disposed between the first electrode 104 and the carrier transport layer 106L2. The light-emitting unit 10a includes an organic material, which may be placed in any one of the carrier transport layer 106L2, the carrier injection layer 106L1 or the organic emission layer 106L3 in the light-emitting unit 10a according to different implementations. In some embodiments, the organic material has an absorption rate of greater than or equal to 50% for a specific wavelength. In some embodiments, the organic material has an absorption rate of greater than or equal to 60% for a specific wavelength. In some embodiments, the organic material has an absorption rate of greater than or equal to 70% for a specific wavelength. In some embodiments, the organic material has an absorption rate of greater than or equal to 80% for a specific wavelength. In some embodiments, the organic material has an absorption rate of greater than or equal to 90% for a specific wavelength. In some embodiments, the organic material has an absorption rate of greater than or equal to 95% for a specific wavelength.

In some embodiments, the specific wavelength is not greater than 400 nm. In some embodiments, the specific wavelength is not greater than 350 nm. In some embodiments, the specific wavelength is not greater than 300 nm. In some embodiments, the specific wavelength is not greater than 250 nm. In some embodiments, the specific wavelength is not greater than 200 nm. In some embodiments, the specific wavelength is not greater than 150 nm. In some embodiments, the specific wavelength is not greater than 100 nm.

The substrate 100 has a first surface 100a and a second surface 100b that are opposite to each other, and includes a transparent material. The substrate 100 is located below the first electrode 104. The second surface 100b of the substrate 100 is in contact with the first electrode 104. In some embodiments, the substrate 100 may include a thin-film-transistor (TFT) array. In some embodiments, the substrate 100 includes a base (not shown), a dielectric layer (not shown) and one or more circuits (not shown) disposed on or in the base. In some embodiments, the base is a transparent base, or at least a portion thereof is transparent. In some embodiments, the base is a non-flexible base, and the material of the base may include glass, quartz, low temperature poly-silicon (LTPS) or other suitable materials. In some embodiments, the base is a flexible base, and the material of the base may include transparent epoxy resin, polyimide, polyvinyl chloride, methyl methacrylate or other suitable materials. The dielectric layer may be disposed on the base according to actual need. In some embodiments, the dielectric layer may include silicon oxide, silicon nitride, silicon oxynitride or other suitable materials.

In some embodiments, the circuit may include a complementary metal-oxide-semiconductor (CMOS) circuit, or may include multiple transistors and multiple capacitors adjacent to the transistors, wherein the transistors and capacitors are formed on the dielectric layer. In some embodiments, the transistor is a thin-film transistor (TFT). Each transistor includes source/drain regions (including at least one source region and a drain region), a channel region between the source/drain regions, a gate electrode disposed above the channel region, and a gate insulator between the channel region and the gate electrode. The channel region of the transistor may be made of a semiconductor material, such as silicon or other elements selected from Group IV or Group III and Group V.

Multiple light shielding layers 101a, 101b are formed under the substrate 100. The light shielding layers 101a, 101b are in contact with the first surface first of the substrate 100. The light shielding layers 101a, 101b are separated from the substrate 100. The light shielding layers 101a, 101b may also be collectively referred to as patterned light shielding layers 101a, 101b. The light shielding layers 101a, 101b respectively have a first edge 101a2 and a second edge 101b2 spaced apart from each other to form an opening 107 therebetween. The light shielding layers 101a, 101b are separated from each other such that the opening 107 reaches a width W1. The multiple light shielding layers 101a, 101b may be connected to each other, but the portions separated from each other may also be called an opening 107. The opening 107 has a width W1 in the lateral direction X. The light shielding layers 101a, 101b may absorb more than 90% of visible light. In some embodiments, the light shielding layers 101a, 101b may have a black body material. In some embodiments, the light shielding layers 101a, 101b include a layer of single material. In some embodiments, the light shielding layers 101a, 101b include a composite layer formed of multiple materials. In some embodiments, the light shielding layers 101a, 101b include an organic material. In some embodiments, the light shielding layers 101a, 101b include an inorganic material. In the embodiment shown in FIG. 2, there is air or vacuum between the openings 107 and outside the openings 107 without other components being arranged.

The light shielding layers 101a, 101b may each have a first inclined portion 101a1 and a second inclined portion 101b1. The first edge 101a2 is disposed on the first inclined portion 101a1; the second edge 101b2 is disposed on the second inclined portion 101b1. The first edge 101a2 and the second edge 101b2 are inclined from the first surface 100a of the substrate 100 to the inside of the light shielding layers 101a, 101b, that is, the first edge 101a2 is inclined from the left side of FIG. 2 and from the second edge 101b2 is inclined from the right side of FIG. 2. In some other embodiments, the light shielding layers 101a and 101b may not have the first inclined portion 101a1 and the second inclined portion 101b1, and the first edge 101a2 and the second edge 101b2 may be perpendicular to the first surface 100a of the substrate 100.

A conductive layer, such as the first electrode 104, is formed on the second surface 100b of the substrate 100. The first electrode 104 is in contact with the substrate 100. The opening 107 between the light shielding layers 101a, 101b substantially corresponds to the first electrode 104. In this embodiment, it may be known from the perspective of FIG. 2 that the first electrode 104 has a first side surface 104a and a second side surface 104b that are opposite to each other in the longitudinal direction Y, and a first side 104f and a second side 104g at the left and right sides in the lateral direction X. The first side 104a of the first electrode 104 is in contact with the second surface 100b of the substrate 100. The first electrodes 104 are separated from each other. The multiple first electrodes 104 are electrically connected to the substrate 100. FIG. 2 only shows one first electrode 104. Those skilled in the art would easily understand that the light-emitting assembly 10 in FIG. 2 may have multiple first electrodes 104 separated from each other and disposed on the substrate 100.

As shown in FIG. 2, the multiple protrusions 105a, 105b are spaced apart on the second surface 100b of the substrate 100 and cover a part of the first electrode 104. In some embodiments, the protrusions 105a, 105b are located at least adjacent to the first electrode 104. The surrounding areas at opposing sides of the first electrode 104 are covered by the protrusions 105a, 105b. In some embodiments, left edge corners of the first side 104f and the second side surface 104b of the first electrode 104 are completely surrounded by the right side of the protrusion 105a. Right edge corners of the second side 104g and the second side surface 104b of the first electrode 104 are completely surrounded by the left side of the protrusion 105b. In some embodiments, the first side 104f and the second side 104g of the first electrode 104 are completely in contact with the protrusions 105a, 105b, respectively. In some embodiments, the two protrusions 105a, 105b on both sides of the first electrode 104 are separated from each other. In some embodiments, the two first electrodes 104 may be separated from each other by a protrusion 105a. In this embodiment, the first electrode 104 may be an anode. In some embodiments, the first electrode 104 may define an effective light-emitting region 104c and non-effective light-emitting regions 104d, 104e. The configuration between the first electrode 104 and the protrusions 105a, 105b may define the ranges of the effective light-emitting region 104c and the non-effective light-emitting region 104d, 104e. In this embodiment, the parts below the second side surface 104b of the first electrode 104 contacted by the protrusions 105a and 105b are respectively defined as non-effective light-emitting regions 104d and 104e, that is, the left region of the line segment L1 and the right region of the line segment L2. In this embodiment, the portion below the second side surface 104b of the first electrode 104 that is not in contact with the protrusions 105a, 105b is defined as the effective light-emitting region 104c, that is, the region between the line segments L1, L2. In some embodiments, the light-emitting unit 10a has a black area (such as the non-effective light-emitting regions 104d and 104e) and a bright area (such as the effective light-emitting region 104c) when emitting light. The total area of the black area is at least less than 50% of the effective light-emitting region. The effective light-emitting region 104c may also be called an effective lighting region.

In some embodiments, the effective light-emitting region 104c has a width W3 that is at least less than 10 micrometers. In some embodiments, the effective light-emitting region 104c has a width W3 of about 3 micrometers to 6 micrometers. In some embodiments, the effective light-emitting region 104c has a width W3 of about 4 micrometers to 6 micrometers. The effective light-emitting region 104c determines the pixel size of the light-emitting assembly 10 in FIG. 1. Since the width W3 of the effective light-emitting region 104c may be controlled below 10 micrometers, the pixel density of the light-emitting assembly 10 may exceed 1000 or 2000 ppi. In this embodiment, the sum of the widths W4 and W5 of the non-effective light-emitting regions 104d and 104e is smaller than the width W3 of the effective light-emitting region 104c.

In FIG. 2, the substrate 100 has a thickness L in the longitudinal direction Y, the light shielding layers 101a, 101b have a thickness 101I in the longitudinal direction Y, and the first electrode 104 has a thickness 104T in the longitudinal direction Y. In some embodiments, the thickness L of the substrate 100 is greater than the thickness 101I of the light shielding layers 101a, 101b, and the thickness L of the substrate 100 is greater than the thickness 104T of the first electrode 104. In some embodiments, the thickness 101I of the light shielding layers 101a, 101b is greater than the thickness 104T of the first electrode 104. In some embodiments, the thickness 101I of the light shielding layer 101a, 101b is equal to the thickness 104T of the first electrode 104. In some embodiments, the thickness 101I of the light shielding layer 101a, 101b is less than the thickness 104T of the first electrode 104.

The first electrode 104 may have a total thickness in the longitudinal direction Y of about 1500 Å to about 2700 Å. In some embodiments, the first electrode 104 has a total thickness of about 1800 Å to about 2200 Å. In some embodiments, the first electrode 104 has a total thickness of about 2000 Å. The first electrode 104 may be a conductive layer. The first electrode 104 may include ITO, IZO, IGZO, AlCu alloy, AgMo alloy, about 50 Å to 500 Å ITO (or IZO or IGZO) and 500 Å to 2000 Å metal film (Ag, Al, Mg, Au), and about 50 Å to 1000 Å ITO (or IZO or IGZO).

In some embodiments, the first electrode 104 is a composite structure. For example, the first electrode 104 has a conductive film and a transparent conductive film the conductive film. The conductive film is located between the transparent conductive film and the substrate 100. In some embodiments, the conductive film includes aluminum, gold, silver, copper, or the like. In some embodiments, the transparent conductive film includes indium, tin, graphene, zinc, oxygen, and the like. In some embodiments, the first electrode 104 includes a transparent conductive thin film. In some embodiments, the first electrode 104 includes indium tin oxide (ITO). In some embodiments, the first electrode 104 includes indium zinc oxide (IZO). In some embodiments, the first electrode 104 includes indium gallium zinc oxide (IGZO). In some embodiments, a roughness Ra of the transparent conductive film is less than 10 Å. A thickness of the conductive film may range from about 1500 Å to about 3000 Å. A thickness of the transparent conductive film may be between about 80 Å and about 1000 Å.

In some embodiments, the first electrode 104 has at least three different films. A conductive film (such as Al, Cu, Ag, Au, etc.) is disposed between two transparent conductive films. In some embodiments, one of the two transparent conductive films is ITO, one side of which is in contact with the substrate 100 and the other side is in contact with the conductive film. In some embodiments, one of the two transparent conductive films is ITO, one side of which is in contact with the conductive film and the other side is in contact with the protrusions 105a, 105b or the light-emitting material.

In the present embodiment, each protrusion 105a, 105b has a curved surface protruding away from the substrate 100 and covering a peripheral area at two sides of the first electrode 104. The protrusions 105a, 105b may be formed of different shapes. In this embodiment, the protrusions 105a, 105b have a curved convex surface. In some other embodiments, the protrusions 105a, 105b are trapezoidal in shape. In some embodiments, the protrusions 105a, 105b are rectangular in shape. The pattern of the protrusions 105a, 105b is designed according to the pixel arrangement, and the patterned protrusion 105a, 105b may be called the pixel defined layer (PDL). The protrusions 105a, 105b are disposed over the substrate 100. Each protrusion 105a, 105b fills the gap between two adjacent first electrodes 104. Each first electrode 104 is partially covered by the protrusion 105a, 105b. Two opposite sides of each first electrode 104 are partially covered by the protrusion 105a, 105b. The protrusions 105a, 105b may include the photosensitive material.

In this embodiment, the left edge (first outer edge 104h) of the effective light-emitting region 104c of the first electrode 104 is not aligned with the first edge 101a2 of the light shielding layers 101a, 101b in the lateral direction X. The left edge (first outer edge 104h) of the effective light-emitting region 104c of the first electrode 104 is offset by a first distance D1 from the first edge 101a2 of the light shielding layer 101a in the lateral direction X. In this embodiment, the right edge (second outer edge 104i) of the effective light-emitting region 104c is not aligned with the second edge 101b2 of the light shielding layer 101b in the lateral direction X. The right edge (second outer edge 104i) of the effective light-emitting region 104c is offset by a second distance D2 from the second edge 101b2 of the light shielding layer 101b in the lateral direction X. In this embodiment, the width W2 of the first electrode 104 is less than the width W1 of the opening 107. The percentage of the first distance D1 to the width of the light shielding layer 101a, 101b may be greater than or equal to 1%. The percentage of the first distance D1 to the width of the light shielding layer 101a, 101b may be greater than or equal to 5%. The percentage of the first distance D1 to the width of the light shielding layer 101a, 101b may be greater than or equal to 10%. The percentage of the first distance D1 to the width of the light shielding layer 101a, 101b may be greater than or equal to 15%. The percentage of the second distance D2 to the width of the light shielding layer 101a, 101b may be greater than or equal to 1%. The percentage of the second distance D2 to the width of the light shielding layer 101a, 101b may be greater than or equal to 5%. The percentage of the second distance D2 to the width of the light shielding layer 101a, 101b may be greater than or equal to 10%. The percentage of the second distance D2 to the width of the light shielding layer 101a, 101b may be greater than or equal to 15%.

In some embodiments, the absorption rate of the protrusion 105a, 105b for a specific wavelength is greater than or equal to 50%. In some embodiments, the absorption rate of the protrusion 105a, 105b for a specific wavelength is greater than or equal to 60%. In some embodiments, the absorption rate of the protrusion 105a, 105b for a specific wavelength is greater than or equal to 70%. In some embodiments, the absorption rate of the protrusion 105a, 105b for a specific wavelength is greater than or equal to 80%. In some embodiments, the absorption rate of the protrusion 105a, 105b for a specific wavelength is greater than or equal to 90%. In some embodiments, the absorption rate of the protrusion 105a, 105b for a specific wavelength is greater than or equal to 95%. In some embodiments, the specific wavelength is not greater than 400 nm. In some embodiments, the specific wavelength is not greater than 350 nm. In some embodiments, the specific wavelength is not greater than 300 nm. In some embodiments, the specific wavelength is not greater than 250 nm. In some embodiments, the specific wavelength is not greater than 200 nm. In some embodiments, the specific wavelength is not greater than 150 nm. In some embodiments, the specific wavelength is not greater than 100 nm.

The carrier injection layer 106L1 is disposed on exposed surfaces of the protrusion 105a, 105b and the first electrode 104. The carrier injection layer 106L1 continuously covers the exposed surfaces of the protrusion 105a, 105b and the first electrode 104. In some embodiments, the exposed surface of each first electrode 104 is configured for an effective light-emitting region of one light-emitting unit 10a. Optionally, the carrier injection layer 106L1 is in contact with the protrusion 105a, 105b. In some embodiments, the carrier injection layer 106L1 is in contact with the first electrode 104. In some embodiments, the carrier injection layer 106L1 is an organism. In some embodiments, the carrier injection layer 106L1 is configured to perform hole injection. In some embodiments, the carrier injection layer 106L1 is a hole injection layer. In some embodiments, the carrier injection layer 106L1 may have a thickness of about 80 Å to about 500 Å.

The carrier transport layer 106L2 is disposed on exposed surfaces of the protrusion 105a, 105b and the first electrode 104. The carrier transport layer 106L2 is disposed above the carrier injection layer 106L1 and completely covers the carrier injection layer 106L1. The carrier injection layer 106L1 is disposed under the carrier transport layer 106L2. The carrier transport layer 106L2 continuously covers the carrier injection layer 106L1. The carrier transport layer 106L2 covers the multiple protrusions 105a, 105b and the multiple first electrodes 104. Optionally, the carrier transport layer 106L2 is in contact with the carrier injection layer 106L1. In some embodiments, the carrier transport layer 106L2 is an organism. In some embodiments, the carrier transport layer 106L2 is configured to perform hole transport. In some embodiments, the carrier transport layer 106L2 is a first hole transport layer. In some embodiments, the carrier transport layer 106L2 may have a thickness of about 80 Å to about 500 Å.

The organic emission layer 106L3 is disposed on exposed surfaces of the protrusion 105a, 105b and the first electrode 104. The organic emission layer 106L3 is disposed above the carrier transport layer 106L2 and completely covers the carrier transport layer 106L2. The carrier transport layer 106L2 is disposed under the organic emission layer 106L3. The organic emission layer 106L3 continuously covers the carrier transport layer 106L2. The organic emission layer 106L3 covers the multiple protrusions 105a, 105b and the multiple first electrodes 104. Optionally, the organic emission layer 106L3 is in contact with the carrier transport layer 106L2. The organic emission layer 106L3 is configured to emit light with a first color.

In some embodiments, the absorption rate of the organic emission layer 106L3 for a specific wavelength is greater than or equal to 50%. In some embodiments, the absorption rate of the organic emission layer 106L3 for a specific wavelength is greater than or equal to 60%. In some embodiments, the absorption rate of the organic emission layer 106L3 for a specific wavelength is greater than or equal to 70%. In some embodiments, the absorption rate of the organic emission layer 106L3 for a specific wavelength is greater than or equal to 80%. In some embodiments, the absorption rate of the organic emission layer 106L3 for a specific wavelength is greater than or equal to 90%. In some embodiments, the absorption rate of the organic emission layer 106L3 for a specific wavelength is greater than or equal to 95%. In some embodiments, the specific wavelength is not greater than 400 nm. In some embodiments, the specific wavelength is not greater than 350 nm. In some embodiments, the specific wavelength is not greater than 300 nm. In some embodiments, the specific wavelength is not greater than 250 nm. In some embodiments, the specific wavelength is not greater than 200 nm. In some embodiments, the specific wavelength is not greater than 150 nm. In some embodiments, the specific wavelength is not greater than 100 nm.

In some embodiments, at least one of the carrier transport layer 106L2 and the organic emission layer 106L3 includes an organic material. The organic material may include a molecular structure having a resonance structure. The organic material may be selected from the group consisting of a spiro-triarylamine, a bis-triarylamine and a combination thereof. In some embodiments, at least one of the carrier transport layer 106L2 and the organic emission layer 106L3 includes the spiro-triarylamine. In some embodiments, at least one of the carrier transport layer 106L2 and the organic emission layer 106L3 includes the bis-triarylamine. In some embodiments, the carrier transport layer 106L2 and the organic emission layer 106L3 comprise the same material. In some embodiments, the carrier transport layer 106L2 includes

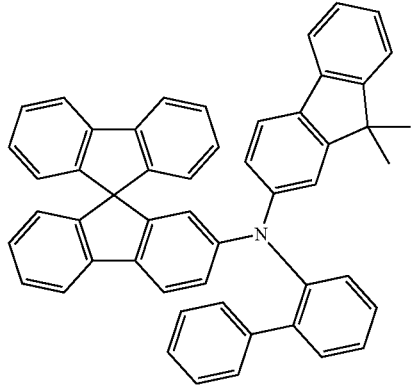 [SMILES: CC1(C)c2ccccc2-c2ccc(N(c3ccc4c(c3)C3(c5ccccc5-c5ccccc53)c3ccccc3-4)c3ccccc3-c3ccccc3)cc21]

and the organic emission layer 106L3 includes

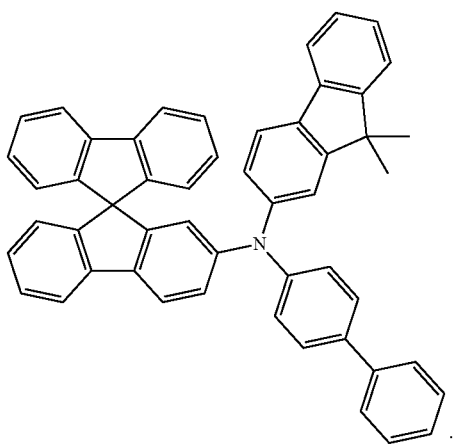 [SMILES: CC1(C)c2ccccc2-c2ccc(N(c3ccc(-c4ccccc4)cc3)c3ccc4c(c3)C3(c5ccccc5-c5ccccc53)c3ccccc3-4)cc21]

In some embodiments, the carrier transport layer 106L2 includes

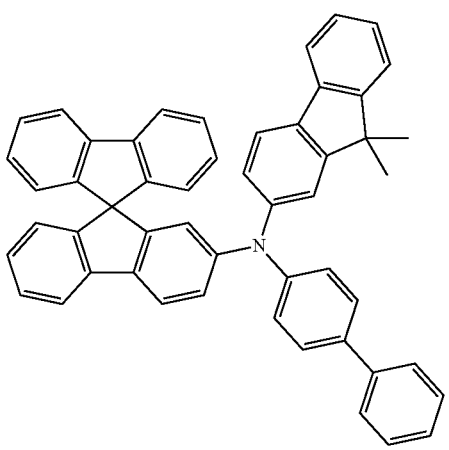 [SMILES: CC1(C)c2ccccc2-c2ccc(N(c3ccc(-c4ccccc4)cc3)c3ccc4c(c3)C3(c5ccccc5-c5ccccc53)c3ccccc3-4)cc21]

and the organic emission layer 106L3 includes

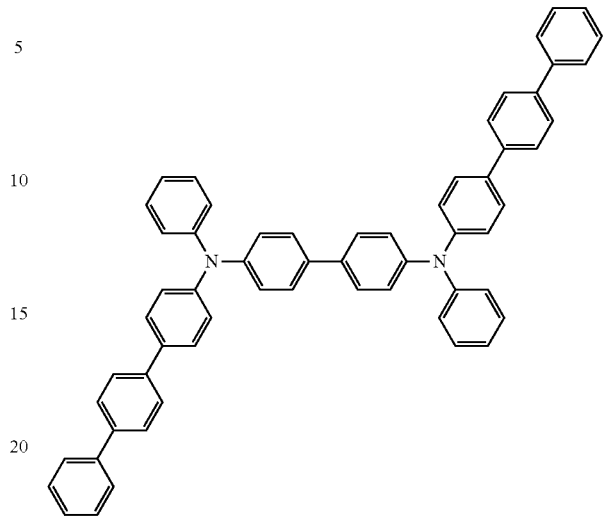

The organic carrier transport layer 106L4 is disposed on exposed surfaces of the protrusion 105a, 105b and the first electrode 104. The organic carrier transport layer 106L4 is disposed on the organic emission layer 106L3 and completely covers the organic emission layer 106L3. The organic emission layer 106L3 is disposed under the organic carrier transport layer 106L4. The organic carrier transport layer 106L4 continuously covers the organic emission layer 106L3. The organic carrier transport layer 106L4 covers the multiple protrusions 105a, 105b and the multiple first electrodes 104. Optionally, the organic carrier transport layer 106L4 is in contact with the organic emission layer 106L3.

In other embodiments, at least a part of the carrier injection layer 106L1, the carrier transport layer 106L2, the organic emission layer 106L3 and the organic carrier transport layer 106L4 of the organic light-emitting stack layer may only be disposed on the first electrode 104 without being disposed on the protrusions 105a, 105b.

In the present embodiment, the second electrode 106D is disposed on the exposed surfaces of the protrusion 105a, 105b and the first electrode 104. The second electrode 106D is located above the organic carrier transport layer 106L4 and completely covers the organic carrier transport layer 106L4. In some circumstances, the second electrode 106D is patterned to cover only the effective light-emitting region 104c of each light-emitting pixel. In some embodiments, the second electrode 106D is in contact with the organic carrier transport layer 106L4.

In this embodiment, the second electrode 106D may have a thickness of about 80 Å to about 500 Å. In some embodiments, the second electrode 106D may have a thickness of about 80 Å to about 150 Å. In some embodiments, the second electrode 106D may have a thickness of about 150 Å to about 200 Å. In some embodiments, the second electrode 106D may have a thickness of about 200 Å to about 300 Å. In some embodiments, the second electrode 106D may have a thickness of about 300 Å to about 400 Å. In some embodiments, the second electrode 106D may have a thickness of about 400 Å to about 500 Å.

In this case, the second electrode 106D may be a cathode. The second electrode 106D may be a metal material, such as silver (Ag), magnesium (Mg) and the like. In some embodiments, the second electrode 106D includes indium tin oxide (ITO) or indium zinc oxide (IZO).

In some embodiments, the second electrode 106D is a composite structure. For example, the second electrode 106D has a conductive film and a transparent conductive film thereon. The conductive film is located between the transparent conductive film and the organic carrier transport layer 106L4. In some embodiments, the conductive film includes aluminum, gold, silver, copper, magnesium, molybdenum, and the like. In some embodiments, the transparent conductive film includes indium, tin, graphene, zinc, oxygen, and the like. In some embodiments, the transparent conductive film is indium tin oxide (ITO). In some embodiments, the transparent conductive film is indium zinc oxide (IZO). In some embodiments, the transparent conductive film is disposed between the conductive film and the organic carrier transport layer 106L4. In some embodiments, the second electrode 106D may be a patterned conductive layer, or a patterned conductive layer with a patterned insulating layer.

Please refer to FIG. 2, the first light S1$a$ is the light emitted from the left edge of the effective light-emitting region 104$c$ of the first electrode 104 to the first edge 101$a$2 of the light shielding layer 101$a$. When the first light S1$a$ is emitted from the left edge (the first outer edge 104$h$) of the effective light-emitting region 104$c$, since the left edge (the first outer edge 104$h$) of the effective light-emitting region 104$c$ has an offset (the first distance D1) from the light shielding layer 101$a$ in the lateral direction, it will be emitted at an angle oblique to the longitudinal direction Y, so that the light emitted by the first outer edge 104$h$ of the effective light-emitting region 104$c$ may have an incident angle $\theta_1$ with respect to the first edge 101$a$2 of the light shielding layer 101$a$. When the first light S1$a$ is emitted from the first side surface 104$a$ of the substrate 100, since the refractive index n1 of the substrate 100 is different from the refractive index $n_2$ of the material (air in this embodiment) in the opening of the light shielding layer, the first light S1$a$ will be deflected to become the first light S1$b$ with an exit angle of $\theta_2$. The exit angle $\theta_2$ is greater than the incident angle $\theta$1. In this way, the configuration of the effective light-emitting region 104$c$ and the light shielding layer 101$a$ will expand the irradiation range of the light.

The second light S2$a$ is the light emitted from the right edge (the second outer edge 104$i$) of the effective light-emitting region 104$c$ of the first electrode 104 to the second edge 101$b$2 of the light shielding layer 101$b$. When the second light S2$a$ is emitted from the right edge (the second outer edge 104$i$) of the effective light-emitting region 104$c$, since the right edge (the second outer edge 104$i$) of the effective light-emitting region 104$c$ has an offset (the second distance D2) from the light shielding layer 101$b$ in the lateral direction, it will be emitted at an angle oblique to the longitudinal direction Y, so that the second light S2$a$ emitted by the second outer edge 104$i$ of the effective light-emitting region 104$c$ has an incident angle $\theta_3$ with respect to the second edge 101$b$2 of the light shielding layer 101$b$. When the second light S2$a$ is emitted from the first side surface 104$a$ of the substrate 100, since the refractive index n1 of the substrate 100 is different from the refractive index n2 of the material (air in this embodiment) in the opening of the light shielding layers 101$a$, 101$b$, the second light S2$a$ will be deflected to become the second light S2$b$ with an exit angle of $\theta_4$. The exit angle $\theta_4$ is greater than the incident angle $\theta_3$. In this way, the configuration of the effective light-emitting region 104$c$ and the light shielding layer 101$b$ will expand the irradiation range of the light.

In some embodiments, the effective light-emitting region 104$c$ is offset by a first distance $D_1$ from the first edge 101$a$2 of the light shielding layer 101$a$ in the lateral direction X, and is associated with (1) the refractive index $n_1$ of the substrate 100, (2) the refractive index n2 of the material (air in this embodiment) inside the opening 107 of the light shielding layer 101$a$ and (3) the thickness L of the substrate 100. In some embodiments, the first distance D1 is further associated with the incident angle $\theta$1 of the first light S1$a$ emitted from the first outer edge 104$h$ of the effective light-emitting region 104$c$ to the first edge 101$a$2 of the light shielding layer 101$a$ (and the first surface 100$a$ of the substrate 100) and the exit angle $\theta_2$ of the first light S1$a$ at the first edge 101$a$2 (and the first surface 100$a$ of the substrate 100). In some embodiments, the first distance D1 satisfies the following formula:

$$D_1 = \frac{n_2 L \sin\theta_2}{\sqrt{n_1^2 - n_2^2 \sin^2\theta_2}}.$$

In some embodiments, the refractive index n1 of the substrate 100 is greater than the refractive index $n_2$ of the material (air in this embodiment) inside the opening 107 between the light shielding layers 101$a$, 101$b$.

The effective light-emitting region 104$c$ is offset by a second distance $D_2$ from the second edge 101$b$2 of the light shielding layer 101$b$ in the lateral direction X, and is associated with (1) the refractive index $n_1$ of the substrate 100, (2) the refractive index $n_2$ of the material inside the opening 107 of the light shielding layer 101$b$ and (3) the thickness L of the substrate 100. In some embodiments, the second distance $D_2$ is further associated with the incident angle $\theta_3$ of the second light S2$a$ emitted from the second outer edge 104$i$ of the effective light-emitting region 104$c$ to the second edge 101$b$2 of the light shielding layer 101$b$ (and the first surface 100$a$ of the substrate 100) and the exit angle $\theta_4$ of the second light S2$a$ at the second edge 101$b$2 (and the first surface 100$a$ of the substrate 100). In some embodiments, the second distance $D_2$ satisfies the following formula:

$$D_2 = \frac{n_2 L \sin\theta_4}{\sqrt{n_1^2 - n_2^2 \sin^2\theta_4}}.$$

With the above correlation, by adjusting the offset between the effective light-emitting region 104$c$ and the light shielding layers 101$a$, 101$b$, the refractive index $n_1$ of the substrate 100, the refractive index $n_2$ of the material inside the opening 107 between the light shielding layers 101$a$ and 101$b$, the thickness L of the substrate 100, and the exit angles $\theta_2$ and $\theta_4$ of the first light S1$a$ and the second light S2$a$ at the first surface 100$a$, the light emitted by the first electrode 104 may be controlled to improve the imaging effect of the pattern. In FIG. 2, the light-emitting assembly 10 includes the substrate 100, the multiple protrusions 105$a$, 105$b$ on the substrate 100, and the multiple light-emitting units separated by the protrusions 105$a$, 105$b$, such as the light-emitting unit 10$a$. The multiple light-emitting units 10$a$ are illustrated as having similar features, but this is merely illustrative and not intended to limit the embodiments. The multiple lighting units 10$a$ may have similar structures or different structures to meet desired functional needs.

The multiple light-emitting units 10a may differ from each other at least in the thickness of the organic light-emitting stack layer. In some embodiments, three light-emitting units 10a may respectively emit green light, red light and blue light.

In some embodiments, the light-emitting units 10a may be configured to be divided into at least three different groups, wherein each group emits a color different from that emitted by other groups. The thickness of each organic light-emitting stack layer may be related to the color displayed by the corresponding light-emitting unit 10a. The organic light-emitting stack layers of the light-emitting unit 10a may be formed through various processes such as vapor deposition, liquid jetting or inkjet printing.

(2) Manufacturing Method of Light-Emitting Assemblies

FIG. 3A to FIG. 3I illustrate a method of manufacturing a light-emitting assembly according to an embodiment.

Figure 3A:
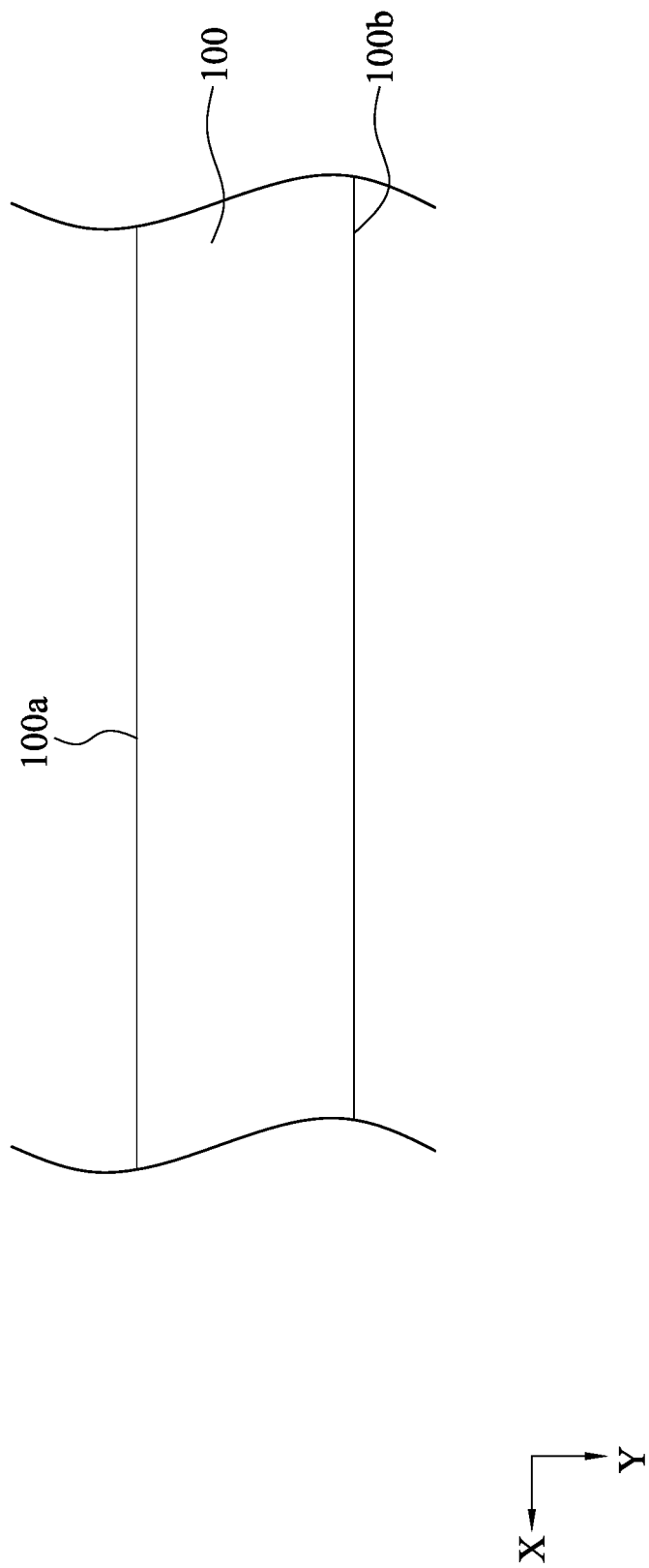
FIG. 3A to FIG. 3I illustrate a process of manufacturing a light-emitting assembly according to an embodiment of the present disclosure.

In FIG. 3A, a substrate 100 is provided, and it has a first surface 100a and a second surface 100b opposite to each other at its upper and lower sides.

Figure 3B:
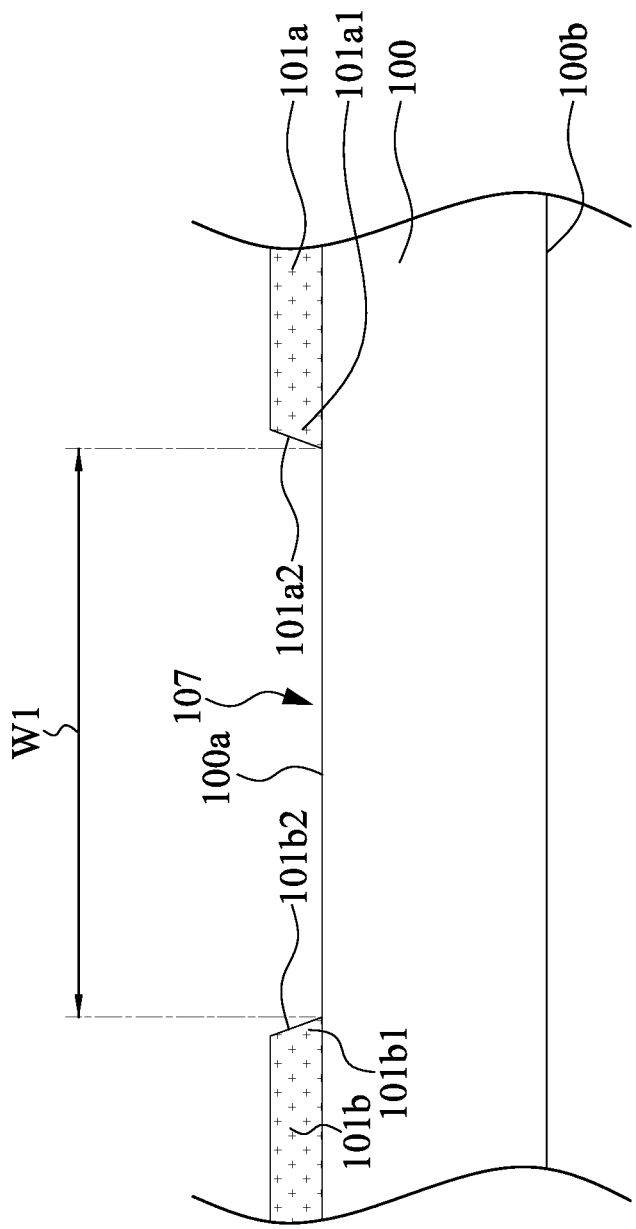

In FIG. 3B, multiple light shielding layers 101a, 101b is disposed on the first surface 100a of the substrate 100. Each light shielding layer 101a, 101b is arranged on the same side of the substrate. Each light shielding layer 101a, 101b is separated from each other to form an opening 107 therebetween, and a width W1 exists between the first edge 101a2 of the first inclined portion 101a1 and the second edge 101b2 of the second inclined portion 101b1. In some embodiments, each light shielding layer 101a, 101b is formed over the substrate 100 by one of chemical vapor deposition (CVD), physical vapor deposition (PVD) and spin-on-glass (SOG) spin coating.

Figure 3C:
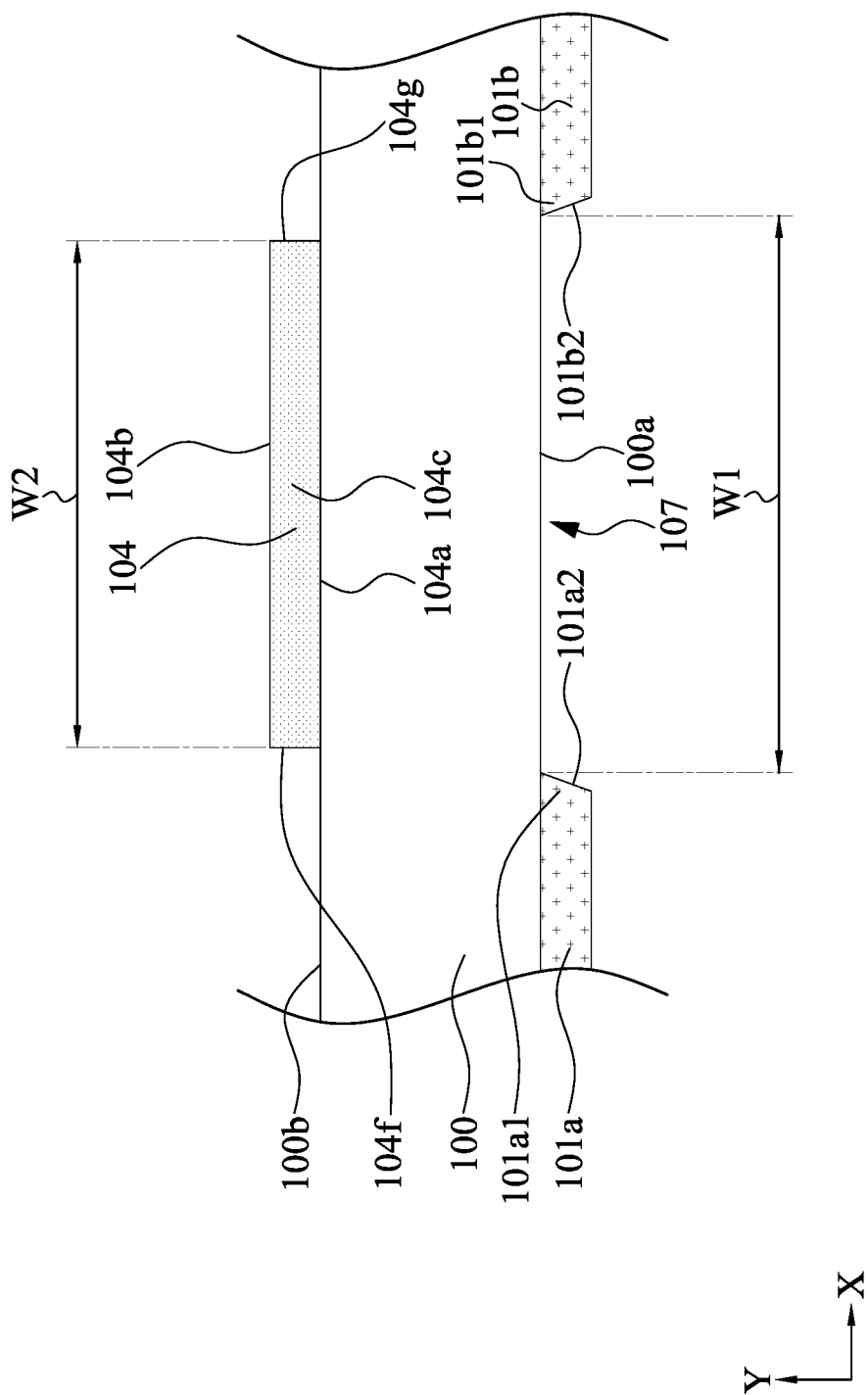

In FIG. 3C, the substrate 100 may be turned over first (i.e, upside down), and multiple first electrodes 104 (that is, the conductive layer, and only one first electrode 104 is shown in FIG. 3) are disposed on the second surface 100b of the substrate 100. Each first electrode 104 is configured to be electrically connected to the substrate 100. The array pattern of the first electrodes 104 is designed in consideration of the arrangement of pixels. The first electrode 104 may have a first side surface 104a and a second side surface 104b opposite to each other, and the first side surface 104a of the first electrode 104 is in contact with the second surface 100b of the substrate 100. The first electrode 104 may have a first side 104f and a second side 104g opposite to each other at the left and right sides respectively. In this embodiment, the first electrode 104 corresponds to the opening 107 between the light shielding layers 101a and 101b. In this embodiment, the width W1 of the opening 107 between the light shielding layers 101a and 101b is greater than the width W2 of the first electrode 104.

Figure 3D:
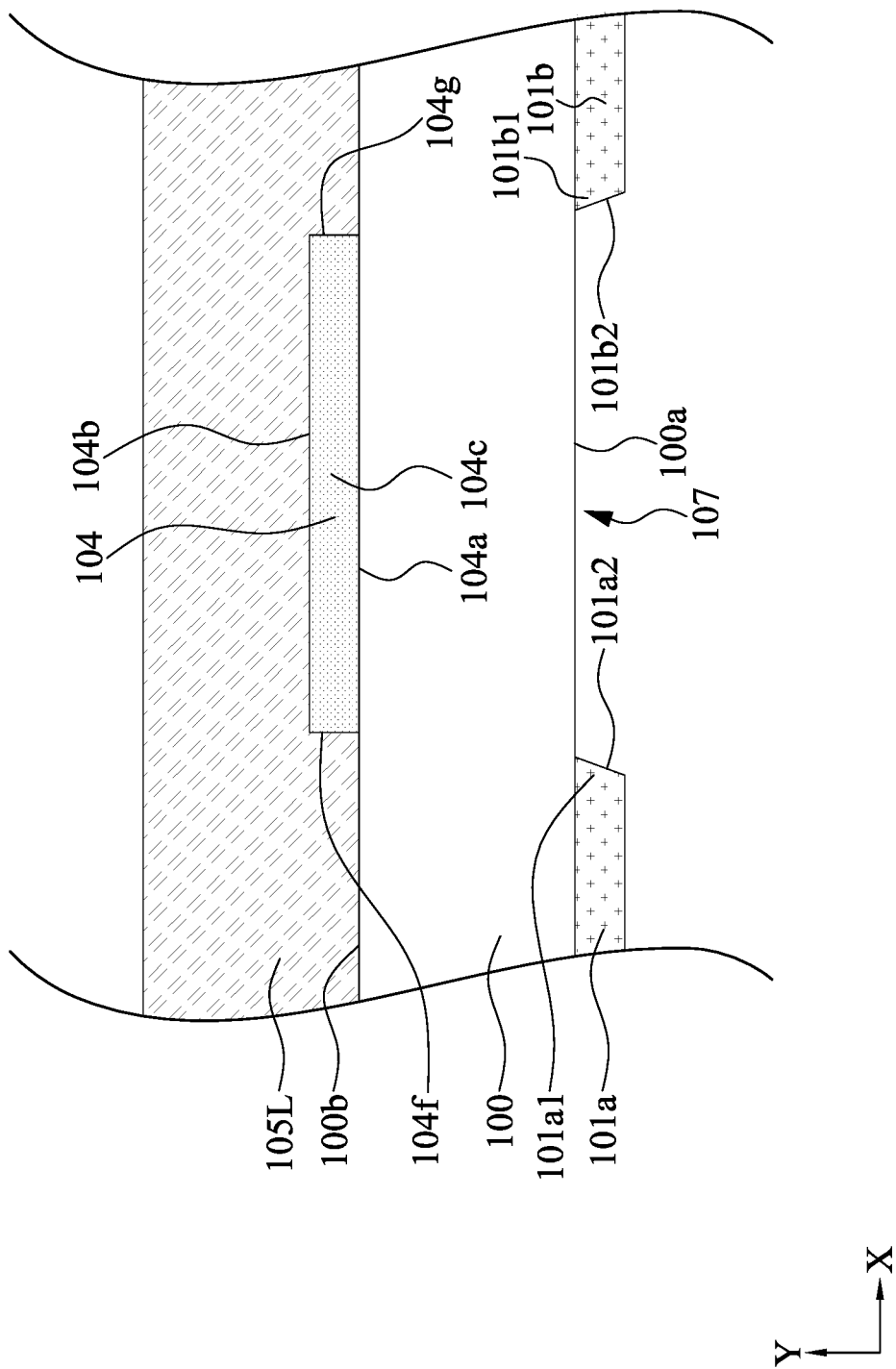

In FIG. 3D, a photosensitive layer 105L is provided on the first electrode 104. In some embodiments, the photosensitive layer 105L is coated on the second side surface 104b of the first electrode 104 and covers the first side 104f and the second side 104g of the first electrode 104. The photosensitive layer 105L may fill in the gaps between the adjacent first electrodes 104. The photosensitive layer 105L is heated to a predetermined temperature, and then the photosensitive layer 105L is exposed to light with a specified wavelength. The photosensitive layer 105L may absorb more than 90% of visible light. After exposure, the photosensitive layer 105L is wetted in a solution for development.

Figure 3E:
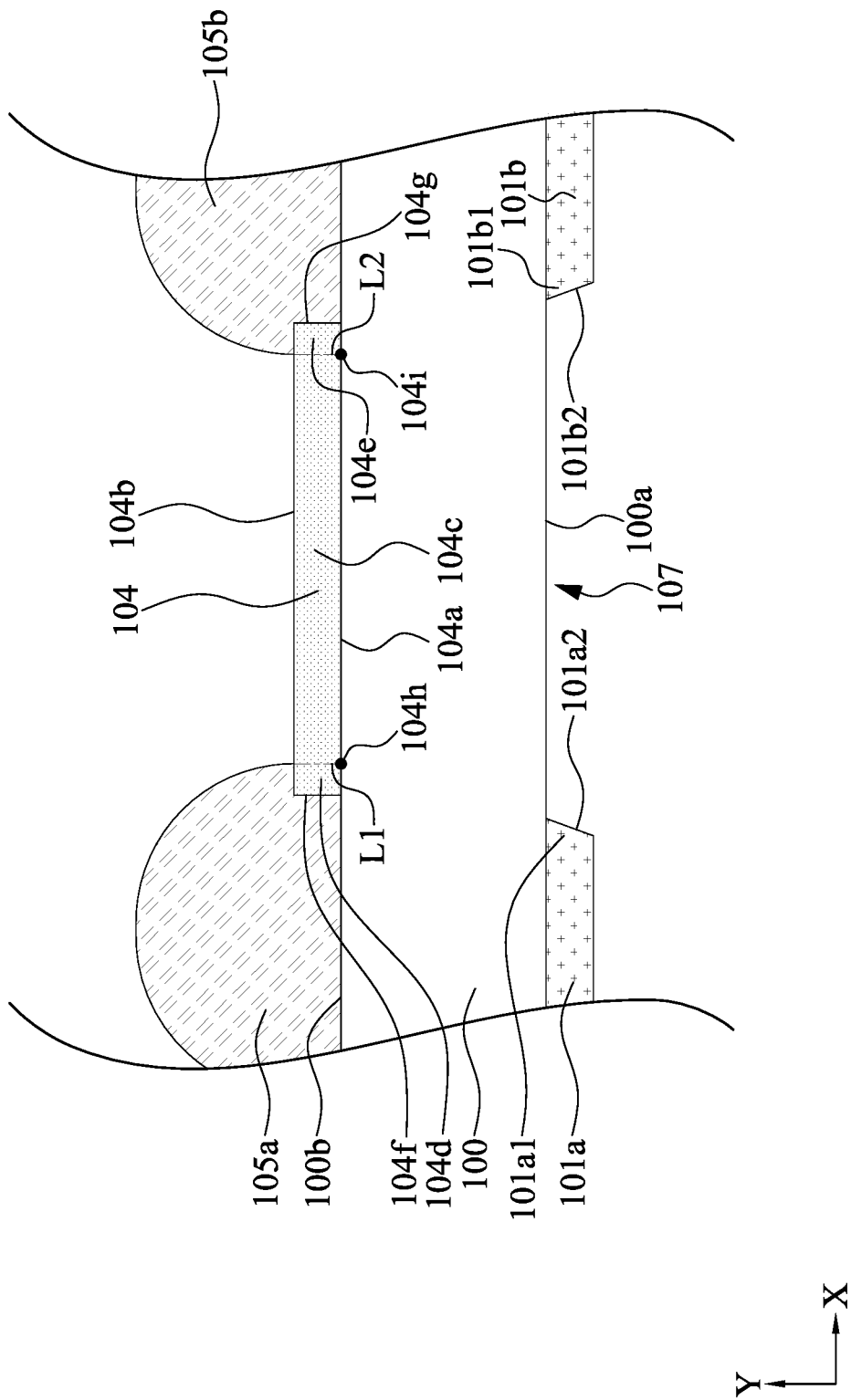

As shown in FIG. 3E, a portion of the photosensitive layer 105L is removed, and the remaining portion partially covers the gap between adjacent first electrodes 104. In this sectional view, the remaining photosensitive layer 105L forms multiple protrusions 105a, 105b, and each protrusion 105a, 105b is formed on both sides of a part of the second side surface 104b of the first electrode 104, and covers the first side 104f and the second side 104g of the first electrode 104. The protrusions 105a, 105b partially cover the respective first electrodes 104. The positions where the edges of the protrusions 105a, 105b in contact with the first electrode 104 are vertically projected onto the first surface 104a while the line segments L1, L2 may be defined as the first outer edge 104h and the second outer edge 104i.

The protrusions 105a, 105b may be formed in different shapes. In FIG. 3E, the protrusions 105a, 105b have a curved surface. In some embodiments, the protrusions 105a, 105b are trapezoidal in shape. After the protrusions 105a, 105b are formed, a cleaning operation is performed to clean the exposed surfaces of the protrusions 105a, 105b and the first electrodes 104. In one embodiment, the deionized water is heated to a temperature between 30° C. and 80° C. during the cleaning operation. After the temperature of the deionized water is raised to a predetermined temperature, the deionized water is introduced to the exposed surfaces of the protrusions 105a, 105b and the first electrodes 104.

In some embodiments, ultrasound is used during the cleaning operation. Ultrasound is introduced into a cleaning agent (such as water or isopropyl alcohol (IPA), etc.). In some embodiments, carbon dioxide is introduced into the cleaning agent. After the cleaning operation, the cleaning agent is removed from the exposed surfaces through a heating operation. During the heating operation, the substrate 100 and protrusions 105a, 105b may be heated to a temperature between 80° C. and 110° C. In some instances, compressed air is directed to the exposed surface to help remove the residue of the cleaning agent while heating.

After the heating operation, the exposed surfaces may be treated with $O_2$, $N_2$, or Ar plasma. Plasma is adopted to roughen the exposed surfaces. In some embodiments, ozone is used to condition the surface state of the exposed surfaces.

Figure 3F:
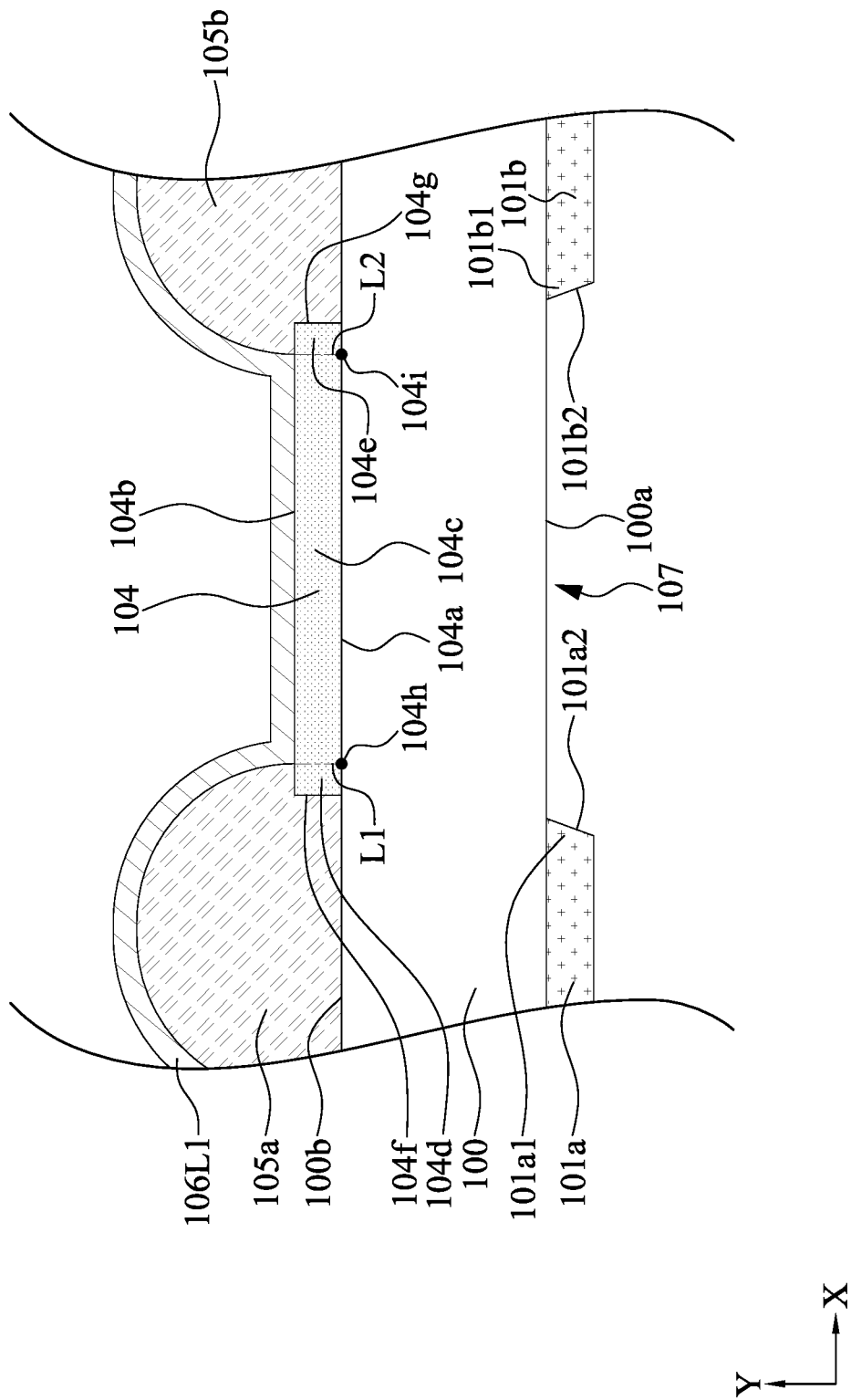

As shown in FIG. 3F, the carrier injection layer 106L1 is disposed on the protrusions 105a, 105b and the exposed surface of the first electrode 104. The carrier injection layer 106L1 performs continuously lining along the exposed surface. More specifically, the area under the surface of the first electrode 104 not contacted by the protrusions 105a, 105b is configured as an effective light-emitting region 104c of a light-emitting unit (i.e., a pixel), and the areas covered by the protrusions 105a, 105b are non-effective light-emitting regions 104d, 104e. In this embodiment, all the light-emitting units use the carrier injection layer 106L1. In some embodiments, the carrier injection layer 106L1 is used for hole injection. In some embodiments, the carrier injection layer 106L1 is used for electron injection. The carrier injection layer 106L1 continuously covers the exposed surfaces of the multiple protrusions 105a, 105b and the first electrodes 104. Optionally, the carrier injection layer 106L1 is in contact with the protrusions 105a, 105b. In one embodiment, the carrier injection layer 106L1 is in contact with the first electrode 104. In some embodiments, the carrier injection layer 106L1 is organic.

Figure 3G:
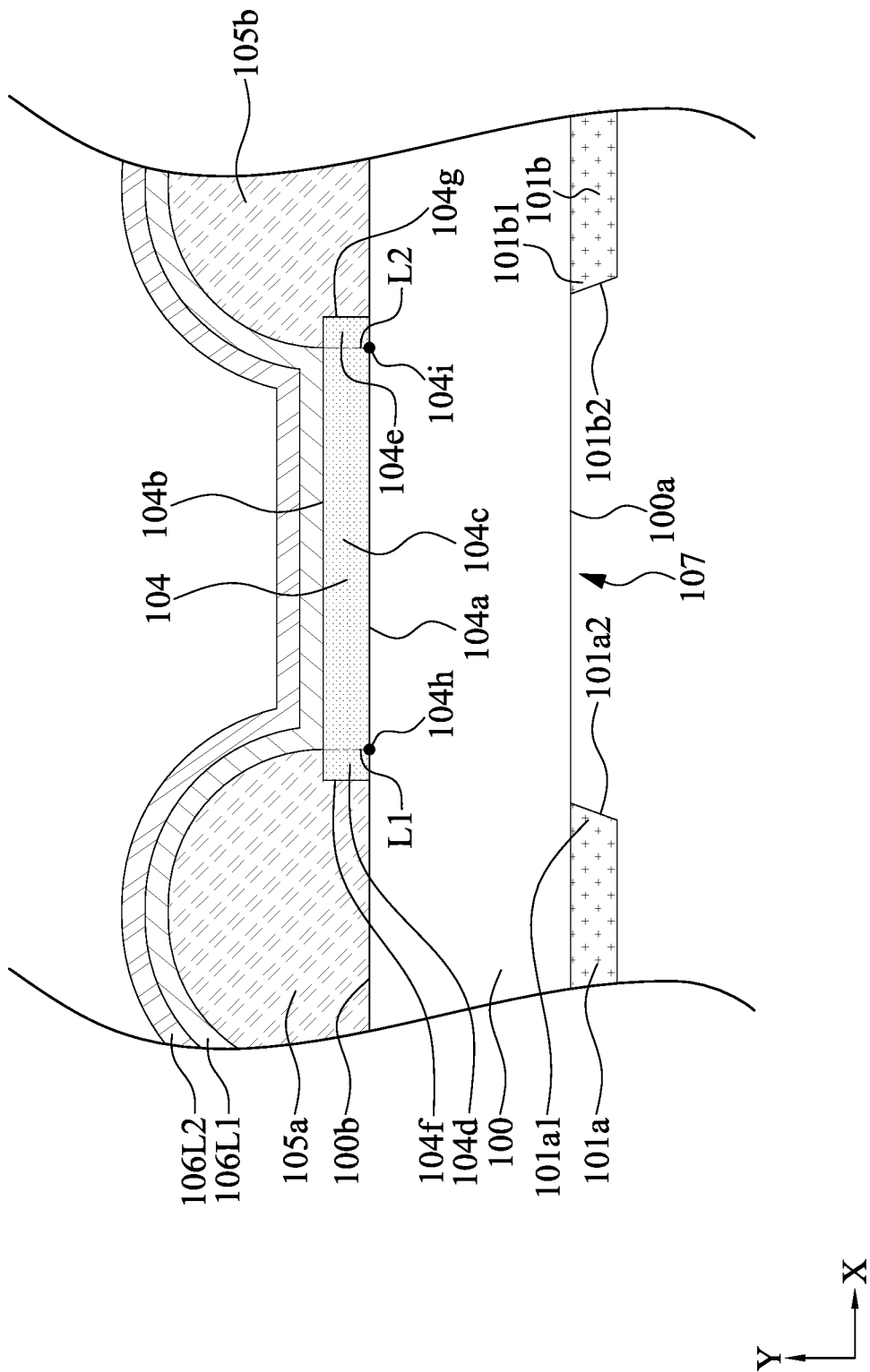

As shown in FIG. 3G, a carrier transport layer 106L2 is disposed on the protrusions 105a, 105b and the exposed surface of the first electrode 104. The carrier injection layer 106L1 is disposed below the carrier transport layer 106L2. The carrier transport layer 106L2 performs continuously lining along the carrier injection layer 106L1. In this embodiment, all the light-emitting units use the carrier transport layer 106L2. In some embodiments, the carrier transport layer 106L2 is used for hole injection. In some embodiments, the carrier transport layer 106L2 is used for electron injection. The carrier transport layer 106L2 continuously covers the multiple protrusions 105a, 105b and the first electrodes 104. Optionally, the carrier transport layer 106L2 is in contact with the carrier injection layer 106L1. In some embodiments, the carrier transport layer 106L2 is organic.

Figure 3H:
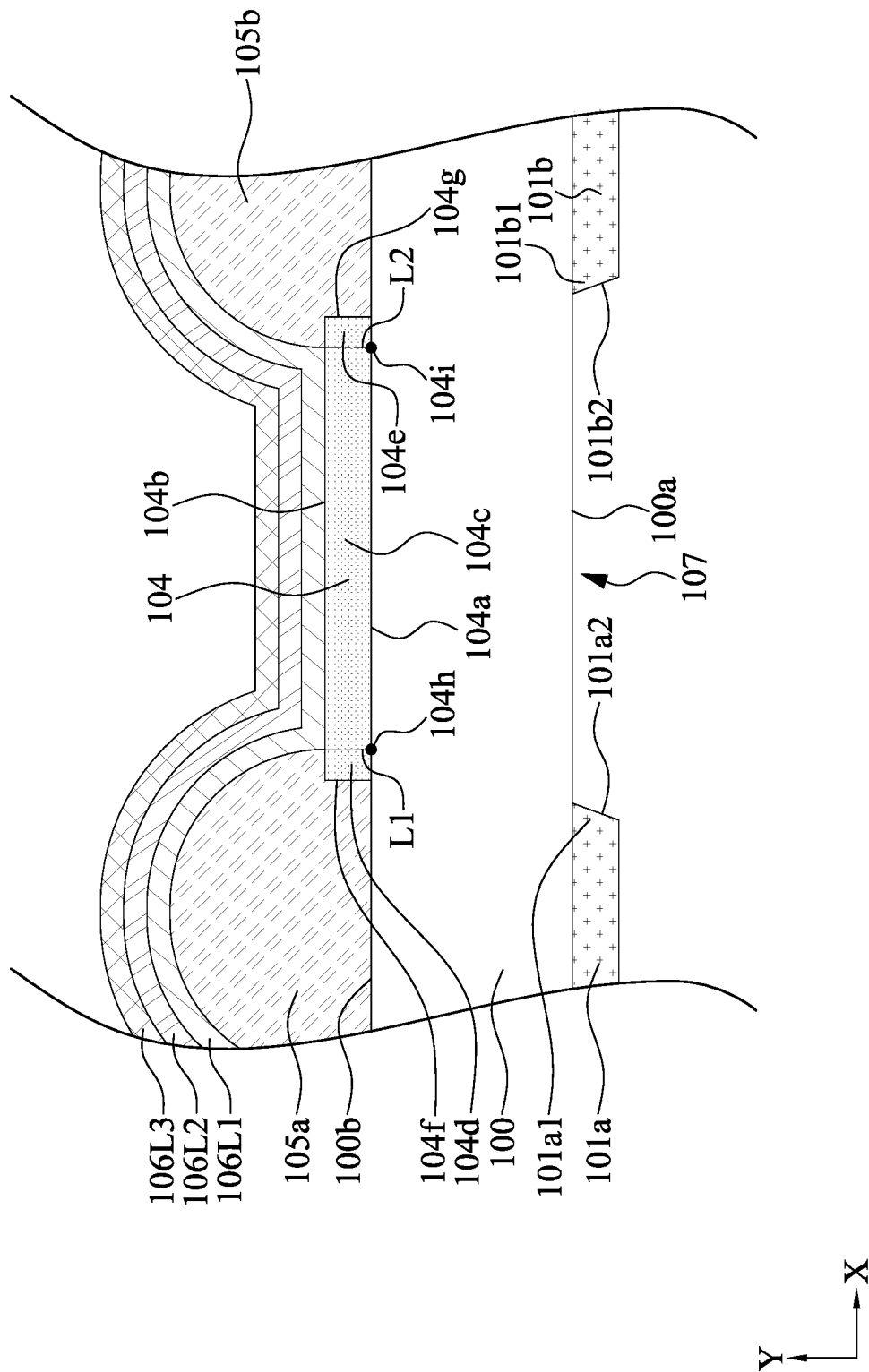

In FIG. 3H, the organic emission layer 106L3 is disposed on the protrusions 105a, 105b and the exposed surface of the first electrode 104. The organic emission layer 106L3 covers the carrier transport layer 106L2. The organic emission layer 106L3 completely covers the exposed carrier transport layer 106L2. The organic emission layer 106L3 is configured to emit a first color.

Figure 3I:
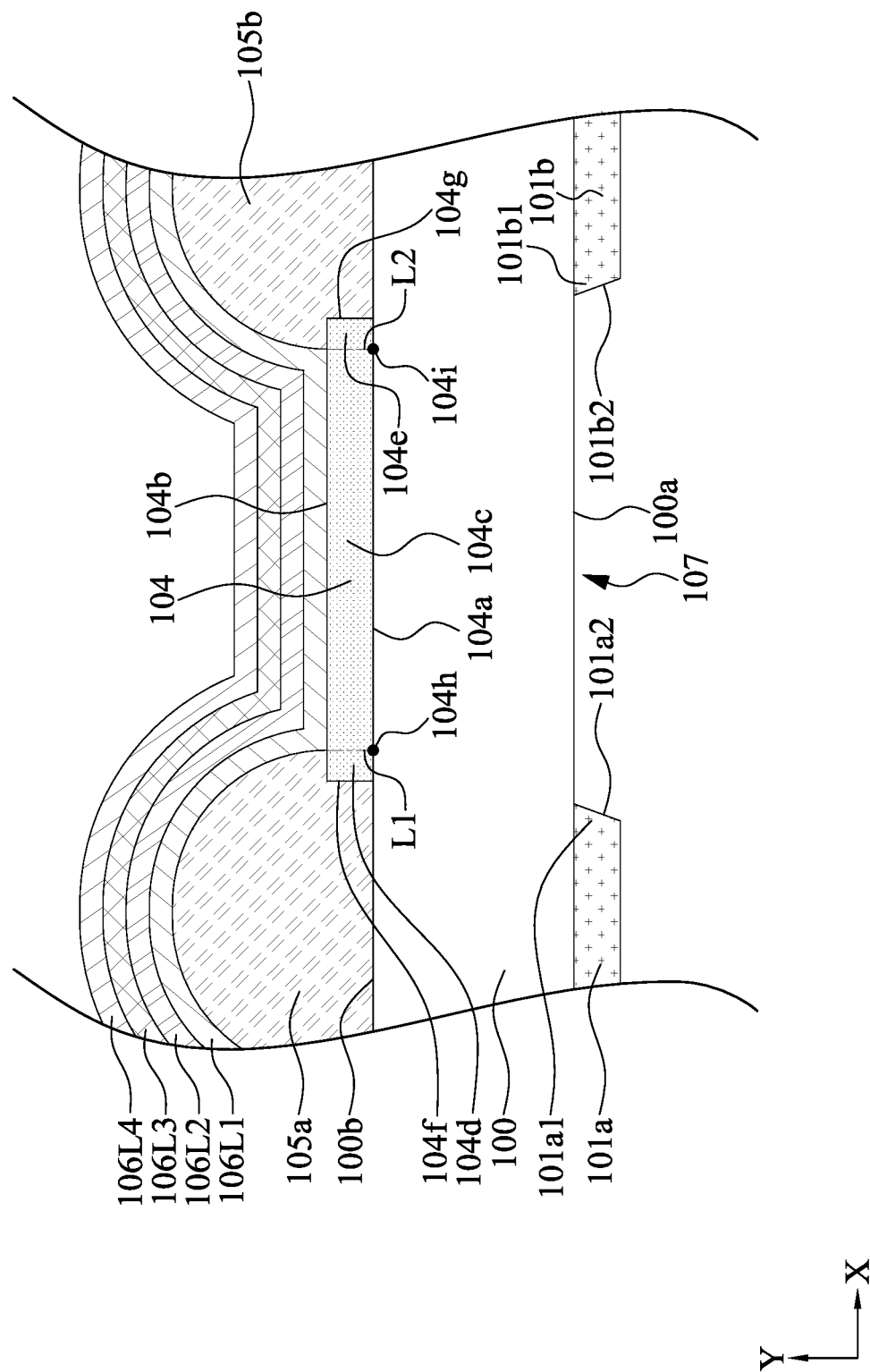

As shown in FIG. 3I, an organic carrier transport layer 106L4 is disposed on the organic emission layer 106L3. The organic carrier transport layer 106L4 may be a hole or electron transport layer. In some embodiments, the organic carrier transport layer 106L4 and the carrier transport layer 106L2 are respectively configured in opposite valence states.

With reference to FIG. 2, the second electrode 106D is disposed on the organic carrier transport layer 106L4. The second electrode 106D covers the organic carrier transport layer 106L4. The second electrode 106D may be a metal material, such as silver (Ag), magnesium (Mg) and the like. In some embodiments, the second electrode 106D includes indium tin oxide (ITO) or indium zinc oxide (IZO). In some embodiments, each light-emitting unit 10a (i.e., pixel) has an independent second electrode 106D from a cross-sectional view.

The operations shown in FIG. 3A to FIG. 3I and FIG. 2 may be repeatedly performed to form light-emitting units of different colors.

As shown in FIG. 2, the light (for example, the first light S1a and the second light S2a) generated by the light-emitting unit 10a may be emitted outwards towards the substrate 100. In some embodiments, part of the light will also be emitted outwards towards the second electrode 106D. When the light towards the second electrode 106D hits the second electrode 106D, different reflected light may be generated due to different materials in the second electrode 106D. The reflected light may interfere with the light (for example, the first light S1a and the second light S2a) generated by the light-emitting unit 10a and emitted towards the substrate 100, thus causing problems such as halo and optical crosstalk, resulting in an unsatisfactory optical effect of the organic light-emitting display. According to the light shielding layers 101a, 101b of the present disclosure, through proper configuration (for example, using the above discussion to shield the ambient light), the interference of the reflected light on the light (for example, the first light S1a and the second light S2a) may be greatly reduced, thereby solving problems such as halo and optical crosstalk, and improving the contrast of the light-emitting unit.

Figures 4A, 4B:
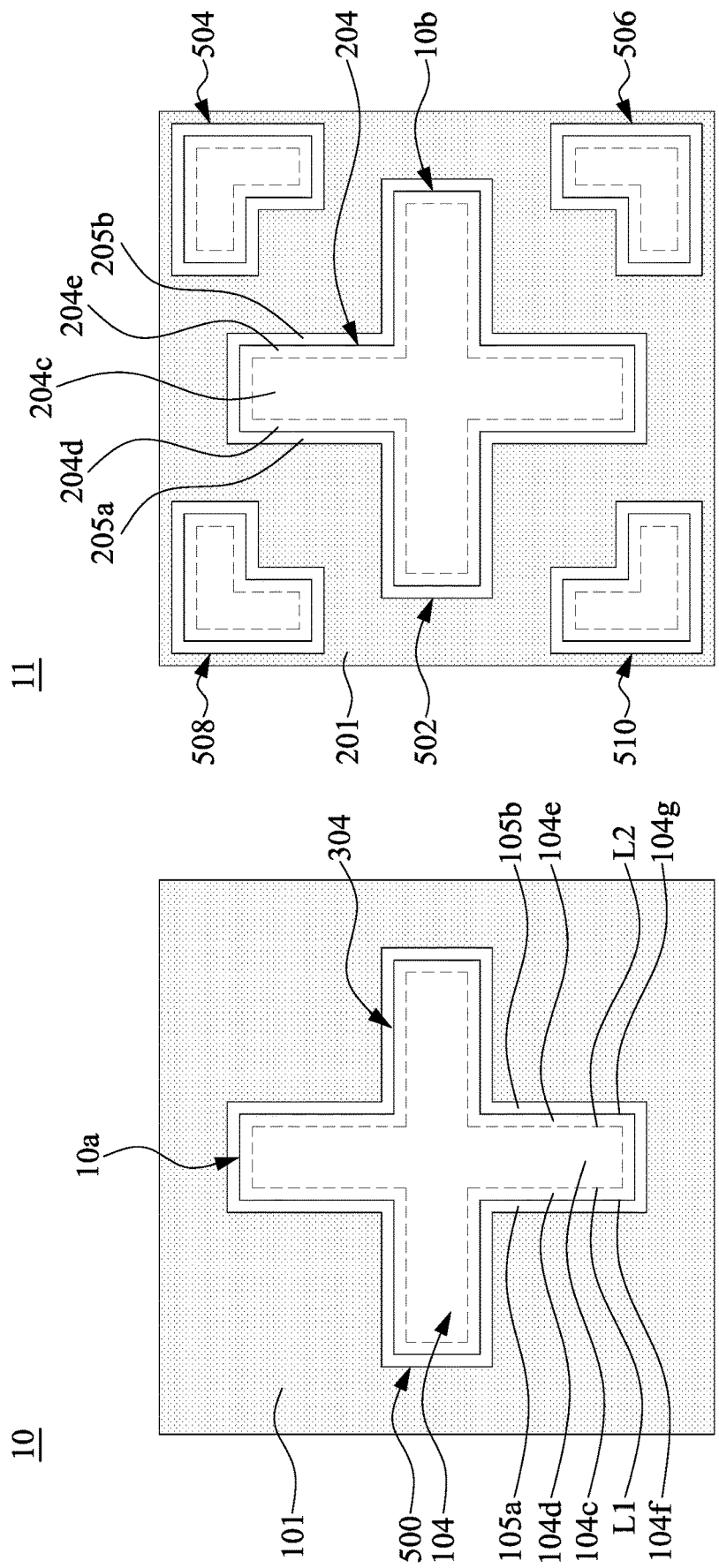
FIG. 4A is a top view of a light-emitting assembly according to a second embodiment of the present disclosure.
FIG. 4B is a top view of a light shielding layer according to a third embodiment of the present disclosure.

Referring to FIG. 4A, which is a top view of a light-emitting assembly according to a second embodiment of the present application. In some embodiments, the light shielding layer 101 may have a depression 500 exhibiting a cross-shaped profile from a top view. The depression 500 with the cross-shaped profile may expose the light-emitting unit 10a, thereby allowing the light emitted by the light-emitting unit 10a to pass through. In some embodiments, the depression 500 with the cross-shaped profile may allow the light emitted by a single light-emitting unit 10a to pass through. In some embodiments, the depression 500 with the cross-shaped profile may allow the light emitted by multiple light-emitting units 10a to pass through. In this embodiment, the depression 500 with the cross-shaped profile at least exposes the effective light-emitting region 104c and the non-effective light-emitting regions 104d, 104e of the first electrode 104 of the light-emitting unit 10a. In this embodiment, the first side 104f and the second side 104g of the first electrode 104 are in contact with the edges of the protrusions 105a, 105b respectively. The depression 500 with the cross-shaped profile exposes at least portions of the non-effective light-emitting regions 104d, 104e adjacent to the protrusions 105a, 105b. As seen from the figure, the area within the line segment L1, L2 (indicated by a dotted line) is the effective light-emitting area 104c of the first electrode 104, and exhibits a cross-shaped profile, while the area outside the line segment L1, L2 in the first electrode 104 are the non-effective light-emitting regions 104d and 104e. The non-effective light-emitting regions 104d, 104e surround the effective light-emitting region 104c. The protrusions 105a, 105b surround the effective light-emitting region 104c and the non-effective light-emitting regions 104d, 104e of the first electrode 104.

Referring to FIG. 4B, which is a top view illustrating a light shielding layer according to a third embodiment. In some embodiments, the light shielding layer 201 may include a first depression 502 and second depressions 504, 506, 508, 510. The first depression 502 has a cross-shaped profile; and the second depressions 504, 506, 508, 510 are located on four sides of the first depression 502 and have an L-shaped profile, so that the first depression 502 and the second depressions 504, 506, 508, 510 together form a crosshair pattern. The crosshair pattern may allow the light emitted by the light-emitting unit (for example 10b) to pass through. In some embodiments, the first depression 502 may overlap with the effective light-emitting area 204c of the single light-emitting unit, allowing the light emitted by the single light-emitting unit to pass through, and at least the non-effective light-emitting regions 204d and 204e may be exposed. In some embodiments, the first depression 502 may further expose the portions of the protrusions 205a, 205b adjacent to the non-effective light-emitting regions 204d, 204e. The protrusions 205a, 205b surround the effective light-emitting region 204c and the non-effective light-emitting regions 204d, 204e of the first electrode 204. In some embodiments, the first depression 502 may overlap with the effective light-emitting area of the multiple light-emitting units, allowing the light emitted by the multiple light-emitting units to pass through. In some embodiments, each of the second depressions 504, 506, 508, 510 may overlap with the effective light-emitting area of a single light-emitting unit, each allowing the light emitted by the single light-emitting unit to pass through. In some embodiments, each of the second depressions 504, 506, 508, 510 may overlap with the effective light-emitting area of the multiple light-emitting units, allowing the light emitted by the multiple light-emitting units to pass through.

Figure 4C:
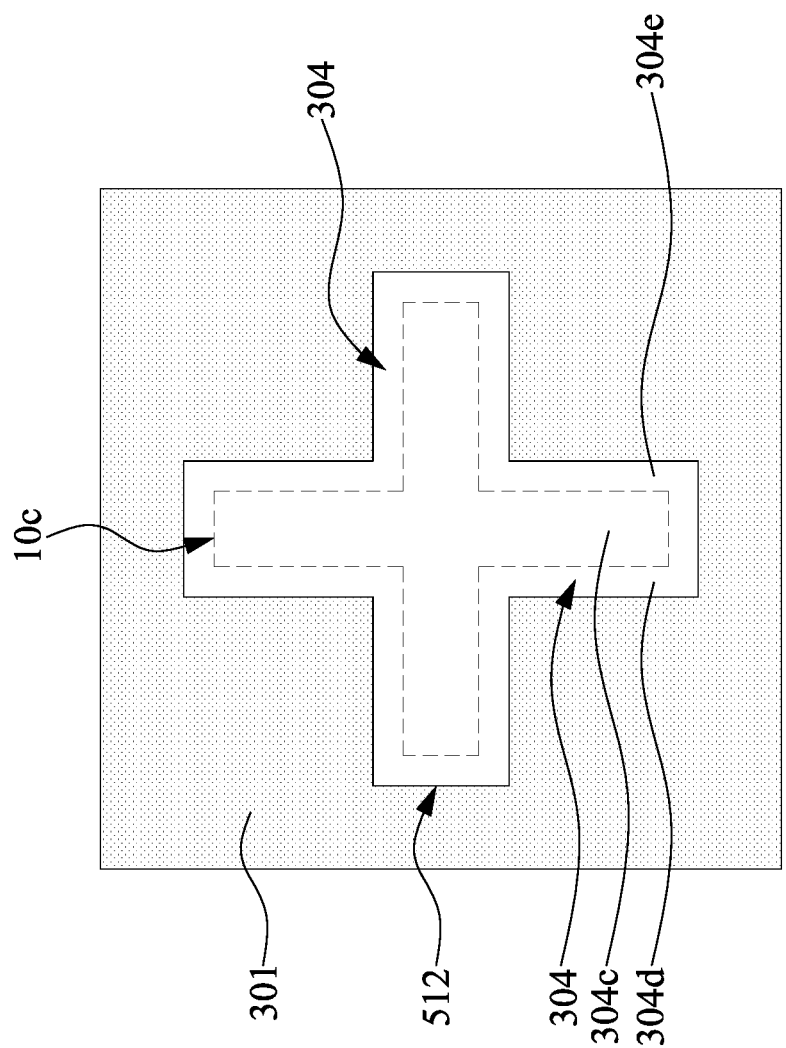
FIG. 4C is a top view of a light-emitting assembly according to a fourth embodiment of the present disclosure.

Please refer to FIG. 4C, which is a top view illustrating a light-emitting assembly according to a fourth embodiment. In this embodiment, the light shielding layer 201 of the light-emitting unit 10c may include a first depression 512. The first depression 512 has a cross-shaped profile. The cross-shaped profile of the first depression 512 exposes the effective light-emitting region 304c and the non-effective light-emitting regions 304d, 304e of the first electrode 304. In this embodiment, the cross-shaped profile of the first depression 512 does not expose any protrusions near the non-effective light-emitting regions 304d, 304e.

(3) Light-Emitting Assembly with Light-Transmitting Layers

Figure 5:
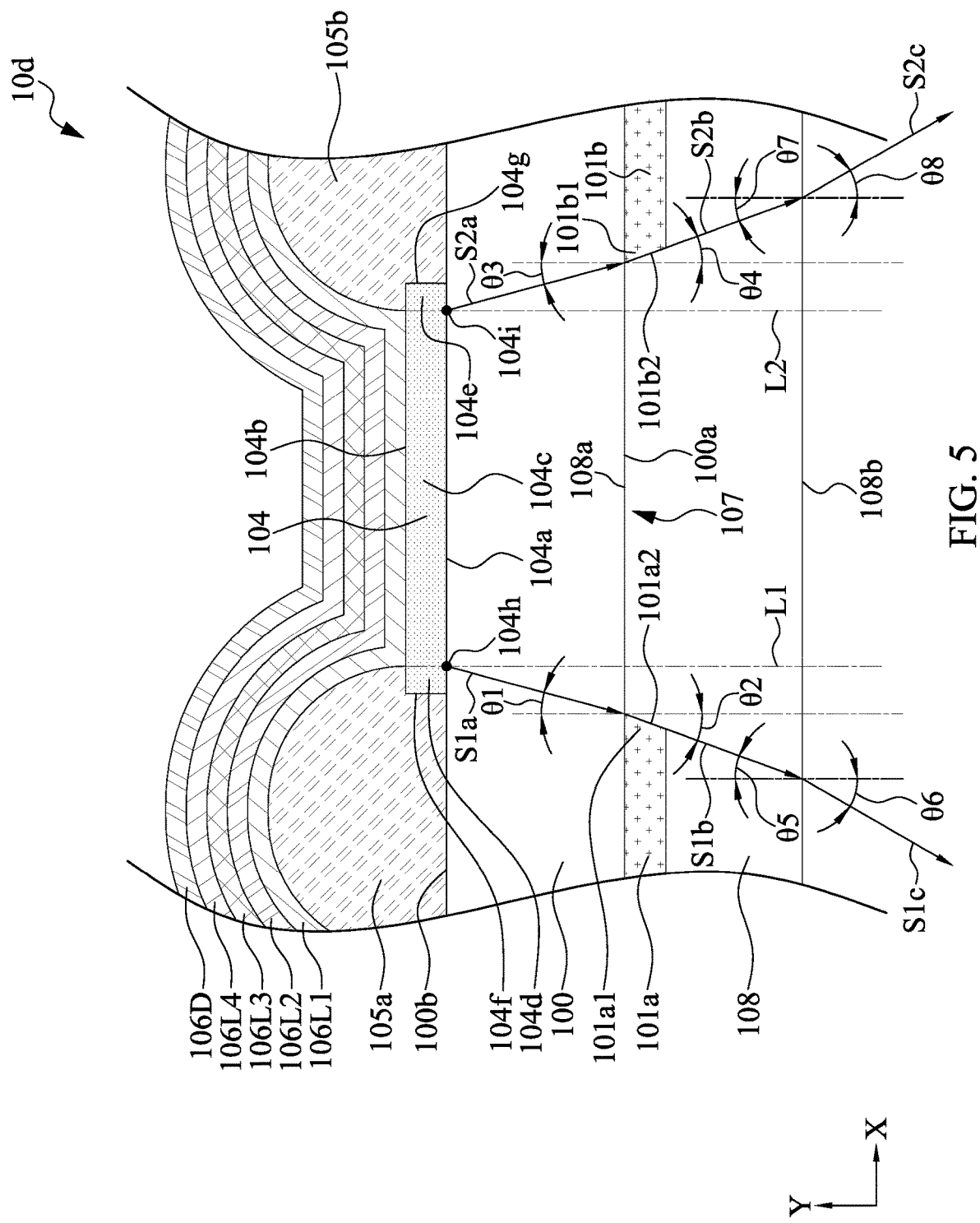
FIG. 5 is a cross-sectional view of a light-emitting assembly according to a fifth embodiment of the present disclosure.

Please refer to FIG. 5, which is a cross-sectional view of a light-emitting assembly 10d according to a fifth embodiment of the present application. In this embodiment, the light-emitting assembly 10d further includes a light-transmitting layer 108 disposed on the first surface 100a of the substrate 100 and covering the light shielding layers 101a, 101b. In this embodiment, the light-transmitting layer 108 has a first surface 108a and a second surface 108b opposite to each other. In this embodiment, the refractive index n1 of the substrate 100 is different from the refractive index $n_3$ of the light-transmitting layer 108. In some embodiments, the refractive index n1 of the substrate 100 is greater than the refractive index $n_3$ of the light-transmitting layer 108. When the first light S1a is incident from the substrate 100 to the light-transmitting layer 108, since the refractive index $n_3$ of the light-transmitting layer 108 is smaller, the incident angle θ1 of the first light S1a is smaller than the exit angle $\theta_2$. When the first light S1b is emitted from the light-transmitting layer 108 to the outside air, the exit angle $\theta_5$ of the first light S1b on the second surface 108b of the light-transmitting layer 108 will be smaller than the exit angle $\theta_6$, so that the first light S1c will expand outward, thereby increasing the angle of view of light.

In this embodiment, similarly, when the second light S2a is emitted from the substrate 100 to the light-transmitting layer 108, since the refractive index $n_3$ of the light-transmitting layer 108 is relatively small, the incident angle $\theta_3$ of the second light S2a will be smaller than the exit angle $\theta_4$. When the second light S2b is emitted from the light-transmitting layer 108 to the outside air, the incident angle $\theta_7$ of the second light S2b on the second surface 108b of the light-transmitting layer 108 will be smaller than the exit angle $\theta_8$, so that the second light S2c will expand outward, thereby increasing the angle of view of light.

The foregoing content outlines the features of some implementations so that those skilled in the art may understand various aspects of the disclosure better. Those skilled in the art should understand that the present disclosure can be easily used as a basis for designing or modifying other processes and structures to reach the same purpose and/or achieve the same advantages as the embodiments described in this application. Those skilled in the art should also understand that this equal configuration does not depart from the spirit and scope of the disclosure, and those skilled in the art can make various changes, substitutions and replacements without departing from the spirit and scope of the disclosure.

What is claimed is:

1. A light-emitting assembly, comprising:
a substrate having a first surface and a second surface that are opposite to each other and having a transparent material;
a light shielding layer disposed on the first surface of the substrate, wherein a first edge and a second edge of the light shielding layer are spaced apart from each other, thereby forming an opening; and
an effective light-emitting region defined on the second surface of the substrate, wherein the effective light-emitting region and the first edge of the light shielding layer are offset by a first distance in a lateral direction;
wherein the first distance is associated with a refractive index of the substrate, a refractive index of a material in the opening of the light shielding layer, and a thickness of the substrate.

2. The light-emitting assembly of claim 1, wherein the first distance is further associated with an incident angle of light emitted by a first outer edge of the effective light-emitting region to the first edge of the light shielding layer and an exit angle of the light on the first surface.

3. The light-emitting assembly of claim 1, wherein the first distance is $D_1$, the refractive index of the substrate is $n_1$, the refractive index of the material in the opening of the light shielding layer is $n_2$, the exit angle of the light on the first surface is $\theta_2$, and the thickness of the substrate is L, wherein the distance $D_1$ satisfies the following formula:

$$D_1 = \frac{n_2 L \sin\theta_2}{\sqrt{n_1^2 - n_2^2 \sin^2\theta_2}}.$$

4. The light-emitting assembly of claim 1, wherein the effective light-emitting region is offset from the second edge of the light-shielding layer by a second distance in the lateral direction, wherein the second distance is associated with the refractive index of the substrate, the refractive index of the material in the opening of the light shielding layer, and the thickness of the substrate.

5. The light-emitting assembly of claim 4, wherein the second distance is further associated with an incident angle of light emitted by a second outer edge of the effective light-emitting region to the second edge of the light shielding layer and an exit angle of the light on the first surface.

6. The light-emitting assembly of claim 1, further comprising:
a conductive layer, of which a first side surface is disposed on the second surface of the substrate, wherein a position of the conductive layer on the second surface substantially corresponds to the opening between the light shielding layer.

7. The light-emitting assembly of claim 6, further comprising:
a plurality of protrusions, arranged at intervals on the second surface of the substrate and at least adjacent to the conductive layer, to together define an effective light-emitting region with the conductive layer.

8. The light-emitting assembly of claim 7, wherein a part of the plurality of protrusions covers an edge of a second side surface of the conductive layer opposite to the first side surface, thereby defining a non-effective light-emitting region of the conductive layer.

9. The light-emitting assembly of claim 8, wherein the opening of the light shielding layer at least exposes the effective light-emitting region and the non-effective light-emitting region.

10. The light-emitting assembly of claim 9, wherein the opening further exposes a portion of the plurality of protrusions adjacent to the conductive layer.

11. The light-emitting assembly of claim 8, wherein the opening in the light shielding layer has a cross-shaped profile.

12. The light-emitting assembly of claim 11, wherein as seen from an outside the cross-shaped profile, the effective light-emitting region is surrounded by the non-effective light-emitting region and a part of the plurality of protrusions adjacent to the conductive layer.

13. The light-emitting assembly of claim 7, further comprising an organic light-emitting stack layer disposed over the conductive layer and in contact with the plurality of protrusions.

14. The light-emitting assembly of claim 13, wherein the organic light-emitting stack layer includes:
- a carrier injection layer;
- a carrier transport layer;
- an organic emission layer; and
- an organic carrier transport layer.

15. The light-emitting assembly of claim 1, wherein a width of the effective light-emitting region located on the second surface is smaller than a distance of the opening in the light shielding layer.

16. The light-emitting assembly of claim 1, further comprising:
- a light-transmitting layer disposed on the first surface and covering the light shielding layer.

17. The light-emitting assembly of claim 16, wherein a refractive index of the substrate is different from a refractive index of the light-transmitting layer.

* * * * *